United States Patent [19]

Nakai et al.

[11] Patent Number: 4,906,942
[45] Date of Patent: Mar. 6, 1990

[54] FREQUENCY DEMODULATOR WITH REVERSAL PHENOMENON COMPENSATION

[75] Inventors: Takahiro Nakai; Keiji Hatanaka; Yoshiko Hatano, all of Nagaokakyo, Japan

[73] Assignee: Mitsubishi Denki Kabushiki Kaisha, Tokyo, Japan

[21] Appl. No.: 284,657

[22] Filed: Dec. 15, 1988

[30] Foreign Application Priority Data

| Dec. 17, 1987 | [JP] | Japan | 62-322159 |
| Dec. 17, 1987 | [JP] | Japan | 62-322158 |
| Apr. 21, 1988 | [JP] | Japan | 63-100485 |
| May 27, 1988 | [JP] | Japan | 63-130874 |

[51] Int. Cl.[4] .................................................. H03K 5/22
[52] U.S. Cl. ...................................... 329/318; 358/327; 329/341
[58] Field of Search ............... 329/110; 358/21 R, 39, 358/310, 314, 327

[56] References Cited

U.S. PATENT DOCUMENTS 4,510,530 4/1985 Miura et al. ................... 358/327 X

OTHER PUBLICATIONS

M. Hagiwara et al, "TAN Type FM Demodulator Using Digital Signal Processing Technique", disclosed during the session of the Nationside meeting held by the Electronic Communication Society of Japan in 1983.
IEEE Transactions on Consumer Electronics, vol. CE.32, No. 3, Aug. 1986.

Primary Examiner—Eugene R. LaRoche
Assistant Examiner—Robert J. Pascal
Attorney, Agent, or Firm—Birch, Stewart, Kolasch & Birch

[57] ABSTRACT

A frequency demodulator which comprises a digital FM demodulating circuit for demodulating an inputted FM signal and outputting a digital demodulated signal, a discriminator for discriminating whether or not the value of the digital demodulated signal from the digital FM demodulating circuit deviates from an upper limit value or a lower limit value set for a normal demodulating range, and a circuit operable on the basis of a result of the discrimination performed by the discriminator for replacing the value of the demodulated signal deviating from the upper limit value or the lower limit value with a compensation value set to a value approximating the upper limit value in the case where the inputted FM signal which has been demodulated is of a type having upper and lower side-bands suppressed and emphasized, respectively, or with a compensation value set to a value approximating the lower limit value in the case where the inputted FM signal which has been demodulated is of a type having upper and lower side-bands emphasized and suppressed, respectively.

13 Claims, 11 Drawing Sheets

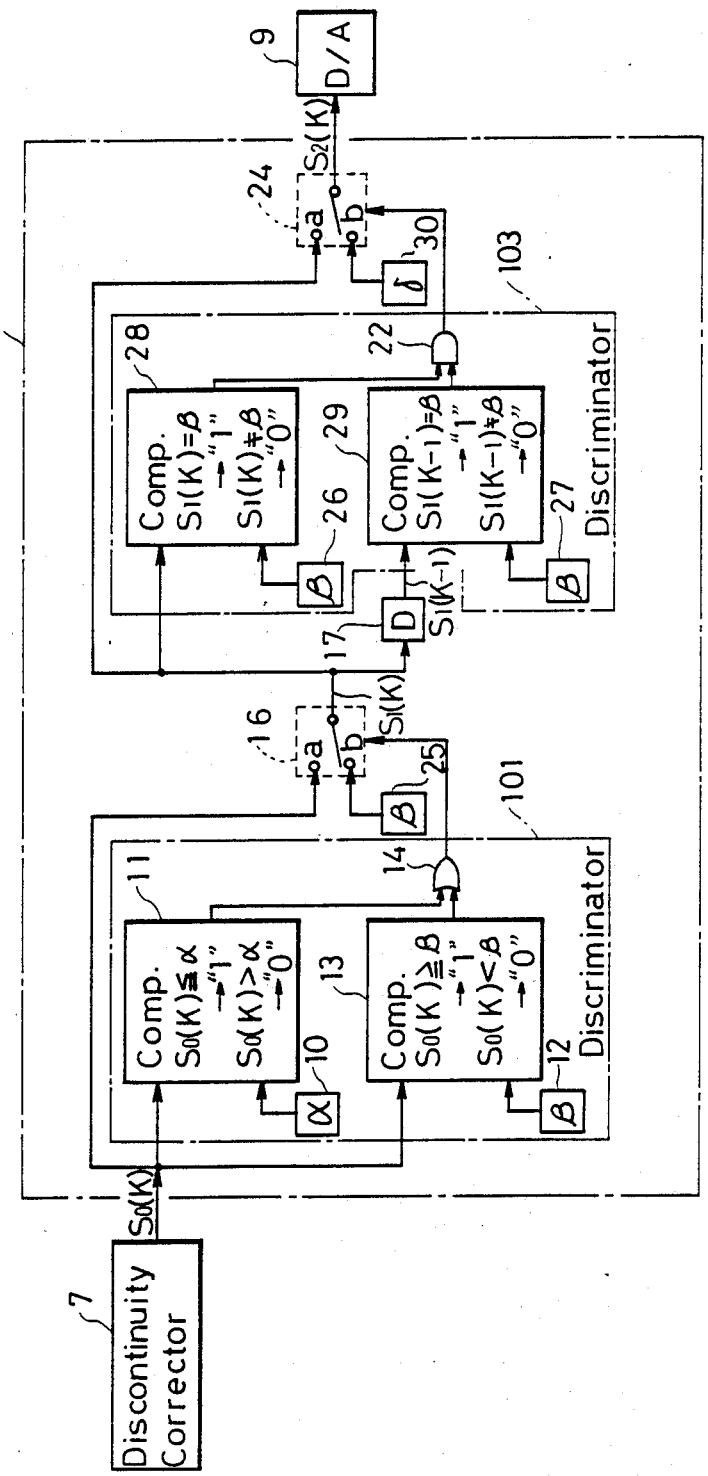

FREQUENCY DEMODULATOR WITH REVERSAL PHENOMENON COMPENSATION

BACKGROUND OF THE INVENTION

1. Field of the Invention

The present invention relates to a frequency demodulator designed to avoid the occurrence of a reversal phenomenon in which a demodulated output from a digital FM demodulating means for a frequency modulated luminance signal reproduced in a video tape recording and/or reproducing apparatus (which apparatus is hereinafter referred to as a video tape player) is reversed.

2. Description of the Prior Art

FIG. 1 of the accompanying drawings illustrates a circuit block diagram of the prior art analog luminance signal processing circuit in the video tape player. Referring to FIG. 1, reference numeral 41 represents a transducer head amplifier for amplifying an analog reproduced FM signal picked up by a magnetic transducer head 40 from a length of magnetic tape 39. The amplified FM signal emerging from the transducer head amplifier 41 is supplied to a reproduced RF equalizer 42. The RF equalizer 42 is connected with a double limiter 43 operable to avoid any possible reversal phenomenon of the analog reproduced FM signal, supplied from the reproduced RF equalizer 42, and also to limit the same analog reproduced FM signal, which limiter 43 is in turn connected with an analog FM demodulator 44 operable to demodulate the output from the double limiter 43. The output from the analog FM demodulator 44 is in turn supplied to low pass filter 46 through a main de-emphasis circuit 45 for de-emphasizing the output from the demodulator 44.

The prior art reproduced luminance signal processing circuit of the above described construction operates in the following manner.

The analog reproduced FM signal outputted from the magnetic transducer head 40 is, after having been amplified by the transducer head amplifier 41, passed to the reproduced RF equalizer 42 having a certain operating characteristic at which the analog reproduced FM signal is modified for the purpose of avoiding the reversal phenomenon and also of securing a certain signal-to-noise ratio so that the upper and lower side-bands of the analog reproduced FM signal can occupy certain respective proportions relative to the carrier wave.

The output from the reproduced RF equalizer 42 is then supplied to the double limiter 43 which subsequently provides an output signal in the form of an analog FM signal of uniform amplitude whose reversal phenomenon is prevented. This analog FM signal emerging from the double limiter 43 is in turn demodulated by the analog FM demodulator 44. The demodulated FM signal from the analog FM demodulator 44 is supplied to the main de-emphasis circuit 45 to pass through a filter having an operating characteristic reverse to that of a pre-emphasis circuit during the recording mode and is thereafter passed through the low pass filter 46 for the removal of unwanted components therefrom.

In the prior art reproduced luminance signal processing circuit of the above described construction, where the FM wave inputted to the analog FM demodulator 44 is an unbalanced FM wave wherein, as a result of its passage through an FM transmission system of certain operating characteristic including a reproduced RF equalizer, the upper and lower side-bands are suppressed and emphasized, respectively, or emphasized and suppressed, respectively, such as observed in the FM wave appearing in the reproduced luminance signal processing circuit employed in video tape players for home use, it has been observed, and so is ascertained through a series of experiments, that the demodulated signal thereof tends to jump out of a predetermined level range to a black or white level side. When such modulated signal is de-emphasized with no correction made thereon and is outputted as a video signal, black or white short sweep lines appear on the display screen thereby to render the reproduced picture uncomfortable to look. Such a phenomenon is generally referred to as the reversal phenomenon.

FIG. 2 illustrates a circuit block diagram showing the TAN type digital FM demodulator disclosed during the session of the nationwide meeting held by the Electronic Communication Society of Japan in 1983 and, also, in IEEE Transactions on Consumer Electronics, Vol. CE. 32, No. 3, August 1986. This digital FM demodulator can be used in place of the analog FM demodulator 44 shown in FIG. 1 for the demodulation of the FM wave. Even though the digital FM demodulator is used in the manner described above, the occurrence of the reversal phenomenon cannot be eliminated.

Hereinafter, the structure and the operation of the digital FM demodulator will be discussed and, in the course thereof, the reversal phenomenon occurring in the digital FM demodulator will also be discussed.

Referring to FIG. 2, reference numeral 1 represents an analog-to-digital converter having a sampling cycle T and operable to convert the input analog FM signal into a digital signal. The FM signal so digiytized by the analog-to-digital converter 1 is shifted 90° in phase by a 90° phase shifter 3 to provide a signal Y. On the other hand, the output from the analog-to-digital converter 1 is also supplied to a delay compensator 2 operable to delay the digital FM signal for a predetermined length of time required for the digital FM signal to match in phase with the 90° phase shifted FM signal, that is, the signal Y. Accordingly, the delayed FM signal X from the delay compensator 2 and the signal Y from the 90° phase shifter 3 can be regarded as signals quantified at the same timing.

Reference numeral 4 represents a calculating circuit capable of performing a calculation of $\tan^{-1}(X/Y)$ with respect to the signals X and Y inputted thereto. An output from the calculating circuit 4 is supplied to a delay circuit 5 for delaying the input signal for a length of time equal to the sampling cycle T. The delayed output from the delay circuit 5 is in turn supplied to a subtractor 6 operable to subtract the output of the delay circuit 5 from the output of the calculating circuit 4.

The FM demodulating operation is carried out accordaing to the following calculations.

Assuming that the analog FM signal at a particular timing t is expressed by X(t) and the same analog FM signal which has been shifted 90° in phase is expressed by Y(t), it is well known to those skilled in the art that the frequency-demodulated signal F(t) of the signal X(t) can be expressed by the following equation.

$$F(t) = (d/dt) \cdot \tan^{-1}[X(t)/Y(t)] \tag{1}$$

The term, $\tan^{-1}[X(t)/Y(t)]$, in the above equation (1) represents the phase of the FM wave at the timing t and, if this term is expressed by $\phi(t)$, the equation (1) above can be rewritten as follows.

$$F(t) = (d/dt) \cdot \phi(t) \qquad (2)$$

The digital FM demodulator 50 shown in FIG. 2 is a hardware which accomplishes the above discussed digital signal processing. In this digital FM demodulator 50, the calculator 4 used therein is constituted by, for example, a read-only memory whose input addresses are represented by the signals X and Y, which read-only memory is so constructed as to store, as its contents, arc tangent ($\tan^{-1}$) values appropriate to (X/Y). With this construction, the calculating circuit 4 can provide, as an output, a signal representative of $\tan^{-1}(X/Y)$ in response to the delayed and phase-shifted digital FM signals X and Y supplied thereto from the delay compensator 2 and the phase shifter 3, respectively.

The output from the calculating circuit 4 is descriptive of the phase $\phi(K \cdot T)$ of the frequency modulated wave at the time $t = K \cdot T$ as hereinbefore described. However, if for the purpose of simplification the phase $\phi(K \cdot T)$ is expressed by $\phi(K)$. (Hereinafter, a similar nomenclature is employed to the phases other than $\phi(K)$.), the output from the delay circuit 5 is expressed by $\phi(K-1)$ and the output from the subtractor 6 is expressed by $\phi(K) - \phi(K-1)$ which is a value descriptive of the increment of the phase of the frequency modulated wave during the sampling cycle T. This difference is expressed by $\Delta \phi(K)$.

The equation (2) above can be approximately expressed as follows when the sampling cycle T is sufficiently short.

$$F(K) \approx [\Delta\phi(K)]/T \qquad (3)$$

Since the sampling cycle T is fixed, the output $\Delta\phi(K)$ from the subtractor 6 can be similar to the demodulated signal F(K) and, therefore, the output $\Delta\phi(K)$ from the subtractor 6 can be regarded as the demodulated signal.

However, the arc tangent ($\tan^{-1}$) is a cyclic function and the cycle thereof is $2\pi$ with due regard paid to the sign taken by each of the delayed and phase-shifted digital FM signals X and Y. Assuming that a table in the read-only memory comprising the calculating circuit 4 has values ranging from zero to $2\pi$, and also assuming, for example, that the value of $\tan^{-1}(X/Y)$ of the input signals X and Y at the timing (K-1) and that at the subsequent timing (K) are $1.9\pi$ (radian) and $2.1\pi$ (radian), respectively, the outputs $\phi(K-1)$ and $\phi(K)$ produced successively from the calculating circuit 4 are $1.9\pi$ (radian) and $0.1\pi$ (radian), respectively, and therefore, a problem tends to occur in that the output $\Delta\phi(K)$ [$= \phi(K) - \phi(K-1)$] from the subtractor 6 may take a negative value ($-1.8\pi$), thereby inviting a discontinuity in this output.

In view of the foregoing, a discontinuity corrector 7 is employed for performing a correction in such a way that, only when the output from the subtractor 6 takes a negative value, $2\pi$ is added to the negative output from the subtractor 6. With this discontinuity corrector 7 used, whenever the output from the subtractor 6 takes a negative value, the discontinuity corrector 7 can provide properly corrected outputs of the subtractor 6 with no discontinuity accompanied. The output from the discontinuity corrector 7 is hereinafter expressed by So(K). When the output So(K) from the discontinuity corrector 7 is subsequently converted by a digital-to-analog converter 9, the frequency demodulated analog signal, that is, the input signal whose frequency has been demodulated, can be obtained.

Where the FM wave inputted to the analog-to-digital converter 1 is an unbalanced FM wave wherein, as a result of its passage through an FM transmission system of certain operating characteristic including a reproduced RF equalizer, one of the upper and lower side-bands is suppressed and the other of the upper and lower side-bands is emphasized such as observed in the FM wave appearing in the reproduced luminance signal processing circuit employed in video tape players for home use, it has been observed, and so is ascertained through a series of experiments, that, in the case of the prior art digital FM demodulator shown in FIG. 2, the demodulated signal thereof tends to jump out of a predetermined level range to a black or white level side. When such demodulated signal is, with no correction made thereon, converted into the analog signal and is then outputted as a video signal, black or white short sweep lines appear on the display screen thereby to render the reproduced picture uncomfortable to look. Such a phenomenon corresponds to what is generally referred to as the reversal phenomenon occurring when the prior art analog FM demodulator is employed and, therefore, the appearance of the black or white short sweep lines on the display screen ocurring when the prior art digital FM demodulator is used is also called the reversal phenomenon for the sake of brevity.

The reversal phenomenon occurring as the result of the use of the prior art digital FM demodulator will now be discussed.

Since the carrier wave having an amplitude A and an angular frequency $\Omega c$ can be expressed on a complex plane as a vector, such vector is expressed by the following equation and is referred to as "carrier wave vector".

$$Ec(\omega ct) = A \cdot e^{j\omega ct}$$

Also, since when the modulated signal is expressed by $em(t) = \Omega d \cdot \cos \omega mt$ the frequency modulated wave can be expressed by a vector having at a timing t a magnitude A and a phase expressed by $(\omega ct + \int_0^t em(t)dt)$ in phase, this vector is referred to as "FM vector".

The FM vector, designated by E(t), can be expressed by the following equation.

$$E(t) = Ec[\omega ct + \int_0^t em(t)dt] = A \cdot e^{j[\omega ct + \int_0^t em(t)dt]} = Ec(\omega ct)e^{jm \cdot \sin \omega mt}$$

wherein m represents a modulation index and is expressed by $\Omega d/\omega m$.

The carrier wave vector $Ec(\omega ct)$ rotates counter-clockwise on a stationary complex plane with passage of time t while depicting a circle having a radius A. Considering the complex plane which rotates together with the carrier wave vector $Ec(\omega ct)$, the complex plane can be contemplated so that the carrier wave vector $Ec(\omega ct)$ can be always matched with a positive direction of a real axis on this complex plane.

If the complex plane is so contemplated, the tip of the frequency modulated vector E(t) depicts a trajectory of a complex number $e^{jm \cdot \sin \omega mt}$, that is, depicts an arc having the center of curvature thereof lying in alignment with the point of origin. This is referred to as a "vector trajectory" of the frequency modulated wave. In other words, the trajectory of the frequency modulated vector E(t), when the carrier wave vector $Ec(\omega ct)$ is taken as a reference vector, corresponds to the figure depicted on an x-y (two dimensional) plane by the frequency modulated vector $E(t) = Ec(\omega ct)\cdot[x+jy]$ at a timing (x, y). This is illustrated in FIG. 3.

Referring now to FIG. 3, the arch shown therein represents the trajectory of the frequency modulated vector E(t) which swings from P to Q and back to P and subsequently from P to R and back to P, that is, P→Q→P→R→P. Also, the frequency modulated vector E(t) can be expressed as follows using Bessel's function Jn(m).

$$E(t) = A \cdot e^{j\omega ct} \cdot \sum_{n=-\infty}^{\infty} Jn(m) \cdot e^{jn\omega mt}$$

However, if in a certain transmission system the n-th order side-band is multiplied by yn, the frequency modulated vector E1(t) obtained after having passed through such certain transmission system can be expressed as follows.

$$E1(t) = A \cdot e^{j\omega ct} \cdot \sum_{n=-\infty}^{\infty} yn \cdot Jn(m) \cdot e^{jn\omega mt}$$

Therefore, the vector trajectory G(t) can be expressed as follows.

$$G(t) = \sum_{n=-\infty}^{\infty} yn \cdot Jn(m) \cdot e^{jn\omega mt}$$

Assuming, for example, that the frequency modulated wave is the one wherein the upper side-band is suppressed and the lower side-band is emphasized, the vector trajectory G(t) will depicts the shape of a ring as shown in FIG. 4 and revolves in a clockwise direction as shown by the arrows. Also, in the case of the transmission system wherein the upper side-band of the frequency modulated wave is further suppressed while the lower side-band thereof is further emphasized, the ring representing the vector trajectory G(t) expands radially outwardly and will, when noises are induced in the frequency modulated wave, depict such a trajectory containing the point of origin as shown in FIG. 5.

In view of the fact that the waveform of each of these frequency modulated waves which have been demodulated is given by the instananeous angular frequency of the vector trajectory of the frequency modulated wave, the demodulated waveform in the case of the vector trajectory as shown in FIG. 3 will represent a sine wave as shown in FIG. 6, and the demodulated waveform in the case of the vector trajectory as shown in FIG. 4 will exhibit a large positive value at a position corresponding to a point P2 shown in FIG. 7 because the point P2 approaches the point of origin with increase in instantaneous angular frequency.

Also, the demodulated waveform in the case of the vector trajectory shown in FIG. 5 will exhibit a negative value wherein the absolute value of the instantaneous angular frequency is of a very high value because it encompasses the point of origin with the point P2 located close to the point of origin, and therefore, at a position corresponding to the point P2, the demodulated wave will exhibit a negative value wherein the absolute value is of a very large value, so far from exhibiting a positive value which it ought to have taken, as shown in FIG. 8. This is called the reversal phenomenon in which the demodulated signal jumps towards the black level side.

Conversely, where the frequency modulated wave is the one wherein the lower side-band thereof is suppressed while the upper side-band thereof is emphasized, the vector trajectory G(t) depicts the shape of a ring as shown in FIG. 9 and revolves in a counterclockwise direction as shown by the arrows in FIG. 9. On the other hand, in the case of the transmission system wherein the lower side-band of the frequency modulated wave is further suppressed while the upper side-band thereof is further emphasized, the ring representing the vector trajectory will expand generally radially outwardly and will, when noises are induced in the frequency modulated wave, exhibit such a trajectory as shown in FIG. 10 containing the point of origin O.

When this frequency modulated wave is demodulated, the demodulated waveform shown in FIG. 3 will represent such a sine wave as shown in FIG. 6, as is the case with the above example, since the vector trajectory of the frequency modulated wave is determined by the instantaneous angular frequency. However, in the case of the demodulated wave as shown in FIG. 9, the demodulated waveform will take a large negative value at a position corresponding to the point P2 shown in FIG. 11 because the point P2 approaches the point of origin and the instantaneous angular frequency increases in a negative direction.

In the case of the demodulated waveform shown in FIG. 10, the vector trajectory encompasses the point of origin with the point P2 located close to the point of origin and, therefore, the instantaneous angular frequency takes a very large positive value. The consequence is that the demodulated waveform exhibits a very large positive value, so far from exhibiting a negative value which it ought to have taken, at the position corresponding to the point P2. This is called the reversal phenomenon in which the demodulated signal jumps towards the white level side.

SUMMARY OF THE INVENTION

The present invention aimed at providing a reversal phenomenon compensator which is effective to ensure a reproduction of pictures on a display screen that are comfortable to look with no reversal phenomenon substantially occurring therein, even though the demodulated output generated from the prior art analog or digital FM demodulator jumps out of its level range to such an extent as to result in the occurrence of the reversal phenomenon.

In order to accomplish the above described object of the present invention, the reversal phenomenon compensator herein disclosed for the purpose of the present invention comprises means for discriminating whether or not the value of a digital demodulated signal demodulated by a digital FM demodulator, or the value of a digital demodulated signal obtained by quantifying an analog demodulated signal demodulated by an analog demodulator, deviates from an upper limit value or a lower limit value set for a normal demodulating range, and means operable on the basis of a result of the discrimination performed by the discriminating means for replacing the value of the demodulated signal deviating from the upper limit value or the lower limit value with a compensation value set to a value approximating the upper limit value in the case where the frequency modulated wave which has been demodulated is of a type having upper and lower side-bands suppressed and emphasized, respectively, or with a compensation value set to a value approximating the lower limit value in the case where the frequency modulated wave which has been demodulated is of a type having upper and lower side-bands emphasized and suppressed, respectively.

With this reversal phenomenon compensator according to the present invention, in the event that the input digital demodulated signal contains a component which deviates from the upper or lower limit value preselected for the normal demodulating range, such component of the digital demodulated signal is replaced by the compensation value approximating to the demodulating level of the frequency modulated wave which has provided the basis for the digital demodulated signal and, therefore, the demodulated signal capable of ensuring the clear reproduction of pictures on the display screen with no white or black sweep lines appearing therein can be obtained.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined solely by the appended claims. In the drawings, like reference numerals denote like parts in the several views, and:

FIGS. 16, 19 and 20 are circuit block diagrams showing reversal phenomenon compensators according to further different embodiments of the present invention, which are suited for use with the frequency modulated wave of a type having upper and lower side-bands suppressed and emphasized, respectively, and outputted from the digital FM demodulator;

DETAILED DESCRIPTION OF THE EMBODIMENTS

Figure 13:
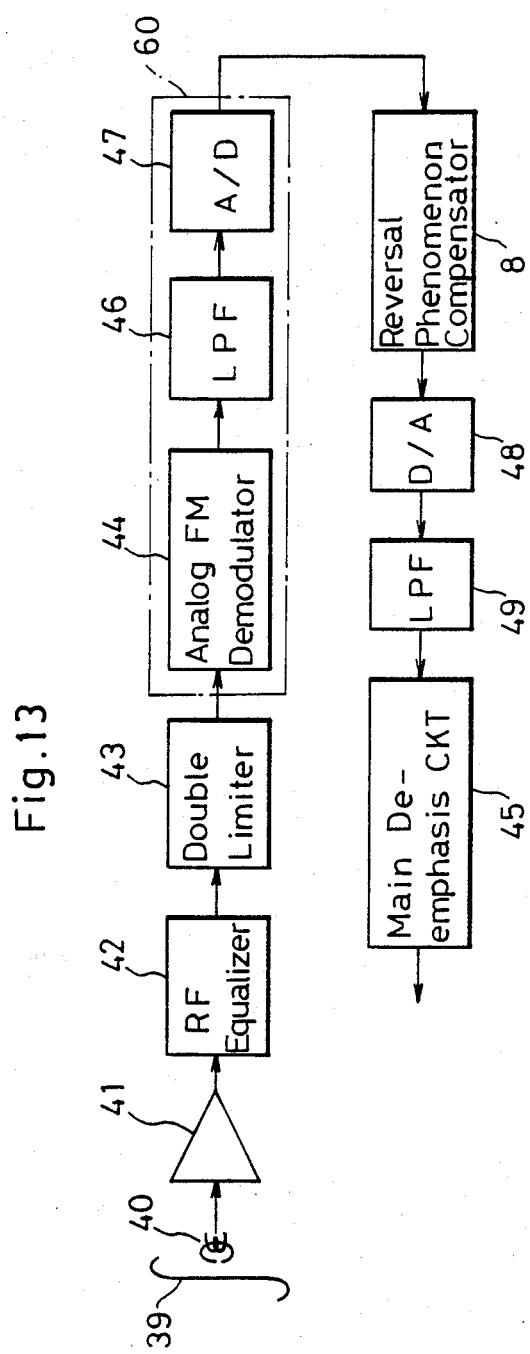
FIG. 13 is a circuit block diagram showing the reproduced luminance signal processing circuit in the video tape player provided with an analog FM demodulator according to the present invention.
Figure 14:
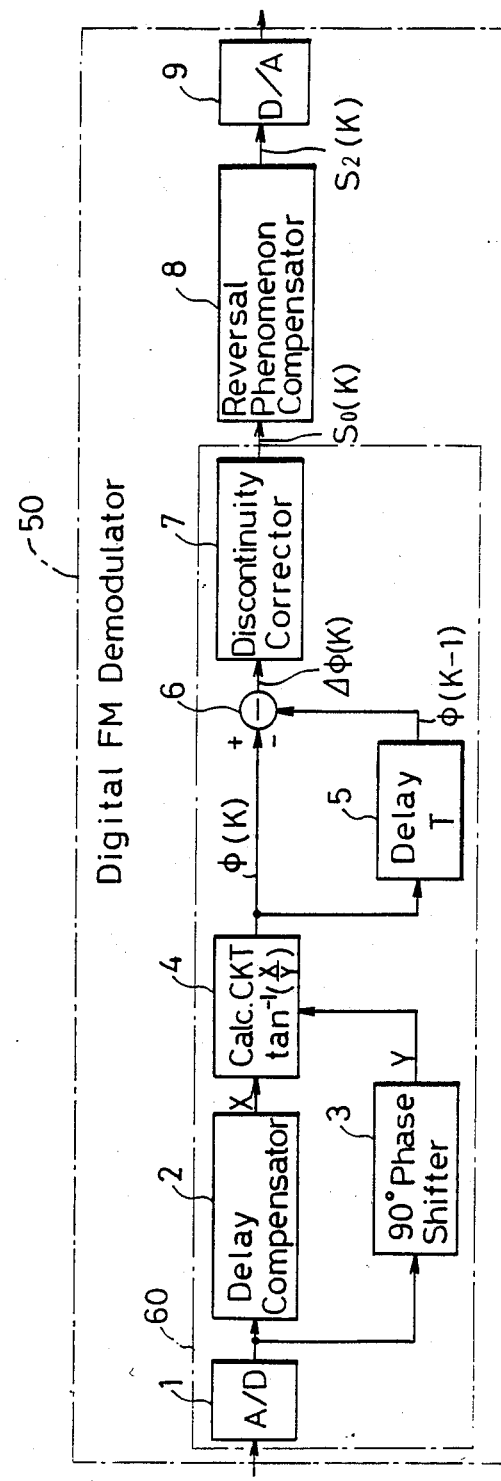
FIG. 14 is a circuit block diagram showing the digital FM demodulator according to the present invention.

FIG. 13 illustrates the application of a reversal phenomenon compensator 8 according to the present invention in a reproduced luminance processing circuit of a type which includes an analog FM demodulator 44 and which is used in a video tape player. On the other hand, FIG. 14 illustrates the application of a reversal phenomenon compensator according to the present invention in a reproduced luminance processing circuit of a type which includes a digital FM demodulator 50 and which is used in a video tape player. In FIGS. 13 and 14, reference numeral 60 represents a digital FM demodulating means. FIGS. 15 to 21 illustrates the details of each of the reversal phenomenon compensators according to respective embodiments of the present invention.

In the first place, the operating principle of the reversal phenomenon compensator herein provided according to the present invention will be discussed as used in association with the digital FM demodulator.

In the case of the video tape player, since the instantaneous maximum and minimum frequencies f1 and f2 of the frequency demodulated signal are fixed according to the frequency allocation of the frequency modulated signal, if the sampling frequency fs is given, the range of increment So(K) of the phase of an output of a discontinuity corrector 7, that is, that of the frequency modulated wave, is theoretically determined provided that the frequency modulated wave is reproduced in the same way as that during the recording mode. By way of example, in the case of the video tape player for home use, since the frequency modulated carrier frequency is fixed at 5.4 MHz at a sync tip and at 7.0 MHz at 100% white, the maximum instantaneous frequency occurs at 210% white clip with the consequence of f1=8.76 MHz whereas the minimum instantaneous frequency occurs at −70% dark clip with the consequence of f2=4.28 MHz. Accordingly, if the sampling frequency fs is, for example, 14.3 MHz, the increment So(K) of the phase during one sampling cycle T (T=1/fs) is $S_o^A = 2\pi \cdot f2 \cdot T$ (rad) at minimum and is $S_o^B = 2\pi \cdot f1 \cdot T$ (rad) at maximum. In other words, if the frequency modulated wave is identical with that during the recording mode, the increment So(K) falls within the range of $S_o^A$ to $S_o^B$ (rad) wherein $S_o^A$ is smaller than $S_o^B$ (rad).

In reality, however, the frequency modulated wave during the reproducing mode is not identical with that during the recording mode, and since the proportion of the lower and upper side-bands of the frequency modulated wave is adjusted to a certain ratio for the purpose of intentionally improving the signal-to-noise ratio by the reproduced RF equalizer or for the purpose of avoiding the reversal phenomenon, the increment So(K) often deviates from the above mentioned demodulating range. In view of this, considering this deviation of the phase of the frequency modulated wave, the range of $\alpha$ to $\beta$ (rad), wherein $\alpha$ is smaller than $S_o^A$ and $\beta$ is greater than $S_o^B$ and which is broader than the range of $S_o^A$ to $S_o^B$ (rad) can be considered an appropriate demodulating range. Then, if the increment So(K) does not fall within the range of $\alpha$ to $\beta$ (rad), it means that any correction is needed to the output from the discontinuity corrector 7.

As hereinbefore discussed, there are two types of the reproduced frequency modulated waves: One is the type wherein the upper and lower side-bands are suppressed and emphasized, respectively, and the other is the type wherein the upper and lower side-bands are emphasized and suppressed, respectively. Once the extent to which the upper and lower side-bands are suppressed and emphasized, respectively, or emphasized and suppressed, respectively, exceeds a certain limit, the reversal phenomenon tends to occur even during the digital FM demodulation, and it has been ascertained by a series of experiments the output So(K) from the discontinuity corrector 7 at the moment this reversal phenomenon has occurred will take a value abnormally higher than $\beta$ (rad) or a value abnormally lower than $\alpha$ (rad), by the following reasons.

Reason 1

It has been theoretically and experimentally confirmed that the increment of the phase during one sampling cycle of the frequency modulated wave of the type wherein one of the side-bands is suppressed and the other of the side-bands is emphasized and which would not result in the reversal phenomenon will be greater or smaller than the increment of the phase of the frequency modulated wave of the type wherein the upper and lower side-bands are in equilibrium, respectively, in the case with the frequency modulated wave of the type wherein the upper and lower side-bands are suppressed and emphasized, respectively, or in the case with the frequency modulated wave of the type wherein the upper and lower side-bands are emphasized and suppressed, respectively. Also, when the demodulated signal of the frequency modulated wave of the type wherein the upper and lower side-bands are suppressed and emphasized, respectively varies from a black level towards a white level, there is a high possibility in which the increment of the true phase of the frequency modulated wave may increase to $2\pi$ (rad) or more or in which, even though the increment may not increase to $2\pi$ (rad) or more, the increment of the true phase of the frequency modulated wave takes a value about equal to $2\pi$, for example, $1.8\pi$. Also, when the demodulated signal of the frequency modulated wave of the type wherein the upper and lower side-bands are emphasized and suppressed, respectively, varies from the white level towards the black level, there is a high possibility in which the increment of the true phase of the frequency modulated wave may take a negative value or in which, even though the increment of the true phase of the frequency modulated wave may not take a negative value, it may take a value about equal to 0 (rad), for example, $0.1\pi$ (rad). All of these occurrences have been theoretically and experimentally confirmed.

Reason 2

In the case of the demodulation of the frequency modulated wave of the type wherein the upper and lower side-bands are suppressed and emphasized, respectively, the reversal phenomenon wherein the black sweep lines occurs in the picture being reproduced on the display screen tends to occur. There is a high possibility in which the increment of the true phase of the frequency modulated wave at the time this reversal phenomenon accompanied by the black sweep lines appearing in the reproduced picture often takes a negative value or, even though it may take a positive value, the increment of the true phase of the frequency modulated wave may take a value lower than $\alpha$ (rad), for example, about $0.1\pi$ (rad).

On the other hand, in the case of the demodulation of the frequency modulated wave of the type wherein the upper and lower side-bands are emphasized and suppressed, respectively, the reversal phenomenon wherein the white sweep lines occurs in the picture being reproduced on the display screen. There is a high possibility in which the increment of the true phase of the frequency modulated wave at the time this reversal phenomenon accompanied by the white sweep lines appearing in the reproduced picture often takes a value higher than $2\pi$ (rad) or, even though it may not take a value higher than $2\pi$ (rad), it may take a value about equal to $2\pi$ (rad), for example, 1.9 (rad). All of these occurrences have been theoretically and experimentally confirmed.

When it comes to the sampling frequency fs, the sampling frequency fs is required to satisfy the sampling theorem with respect to the maximum modulation frequency fm. However, if the sampling frequency is increased to a value higher than necessary, the use is required of expensive analog-to-digital converters and digital-to-analog converters, resulting in the increased cost, and, therefore, the range of fs is naturally limited. Where the frequency of the frequency modulated signal is low, even in the narrow band FM transmission system such as used in the video tape player for home use not only the first side-band, but also the second side-band or higher order side-bands are transmitted through the system and, therefore, the vector trajectory of the frequency modulated wave becomes hard to encompass the point of origin with the consequently minimized occurrence of the reversal phenomenon. However, where the frequency of the frequency modulated signal becomes high, only the first side-band is transmitted through the system and, therefore, the vector trajectory of the frequency modulated wave tends to encompass the point of origin accompanied by the consequent occurrence of the reversal phenomenon. In fact, it has been experimentally confirmed that, when the frequency of the frequency modulated signal is low, no reversal phenomenon occur substantially, but when it becomes high, the reversal phenomenon tends to result in. The reason therefor will now be discussed.

In the case of the video tape player for home use, the carrier frequency fc of the frequency modulated signal is selected so as to satisfy the following relationship relative to the maximum frequency (bandwidth) fm of the frequency modulated signal in order to reduce the FM transmission bandwidth.

$$fc \approx fm + 1 \text{ (MHz)}$$

By way of example, there is a video tape player wherein the carrier frequency fc is about 4.2 MHz when the frequency fm is 3 MHz, and also a video tape player wherein the carrier frequency fc is about 6.5 MHz when the frequency fm is 5 MHz.

On the other hand, as hereinbefore discussed, the sampling frequency fs is required to satisfy the sampling theorem with respect to the maximum modulation frequency fm and must therefore be equal to or higher than 2·fm. However, if the sampling frequency fs is chosen to be of a value about equal to the lowest permissible frequency 2·fm, the use can be made of inexpensive analog-to-digital converters and digital-to-analog converters, but the high frequency region of the demodulated signal will be considerably deteriorated. On the other hand, if the sampling frequency fs is chosen to be of an excessively high value, the deterioration of the high frequency region of the demodulated signal will be minimized, however, the use will be necessitated of expensive analog-to-digital converters and digital-to-analog converters. In view of these, in most cases, the sampling frequency fs is generally chosen to be of a value within the range of 2·fc to 4·fc. (Nevertheless, even in this case, since fs≧2·fc≈2(fm+1)>2·fm, the above discussed sampling theorem is satisfied.)

In the case of the video tape player for home use, since a low frequency conversion color signal is allocated to 0 to 1 MHz and a frequency range of 0 to 1 MHz of the frequency modulated signal is not transmitted in view of the capacity of the electromagnetic conversion, the lower second side-band of the frequency modulated wave is not transmitted if the frequency (fc−2·fP) of such lower second side-band with respect to the modulation frequency fp is within the range of 0 to 1 MHz. Accordingly, the demodulation of such frequency modulated wave tends to result in the occurrence of the reversal phenomenon. Also, even if the frequency (fc−2·fP) of the lower second side-band is of a negative value, this lower second side-band will not be accurately transmitted according to the theory of signal processing and, therefore, the reversal phenomenon tends to result in. Thus, when (fc−2·fP) is equal to or lower than 1 MHz, the reversal phenomenon often occurs. Therefore, it can be said that the reversal phenomenon often occurs when the modulated frequency fP is equal to or higher than (fc−1 [MHz])/2.

When (fc−1 [MHz])/2 is expressed by fo, it can be understood that, of the modulation frequency fP, the length of time of one cycle of the demodulated waveform is longest when the modulation frequency fP is equal to the frequency fo, and therefore, the number of sampling points encompassed during one cycle of the demodulated waveform is maximum. Hereinafter, evaluation will be made as to the maximum number of the sampling points encompassed during one cycle of the demodulated waveform.

As hereinbefore discussed, since the sampling frequency fs is chosen to be of a value within the range of 2·fc to 4·fc, that is, 2·fc ≦ fs ≦ 4·fc, the frequency fc is within the range of fs/4 to fs/2, that is, fs/4 ≦ fc ≦ fs/2.

Accordingly, the frequency fo=fc/2−0.5 (MHz) is within the range of [fs/8−0.5 (MHz)] to [fs/4−0.5 (MHz)], that is,

[fs/8−0.5 (MHz)] ≦ fo ≦ [fs/4−0.5 (MHz)].

Therefore, the relationship between the sampling frequency fs and the modulation frequency fo may be said to have the following relationship of fs/8 < fo < fs/4.

Figure 7:
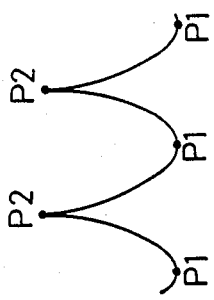
Figure 8:
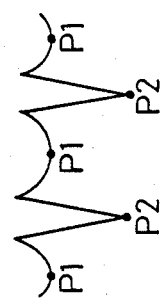
Figure 10:
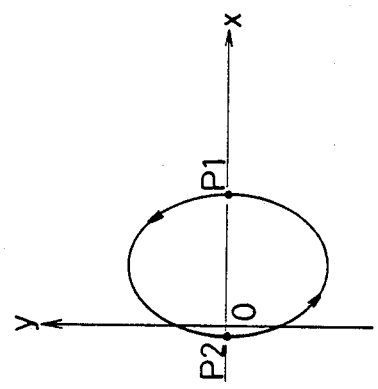
Figure 12:
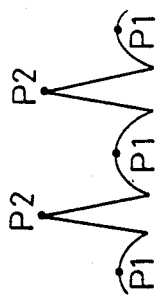
Figure 9:
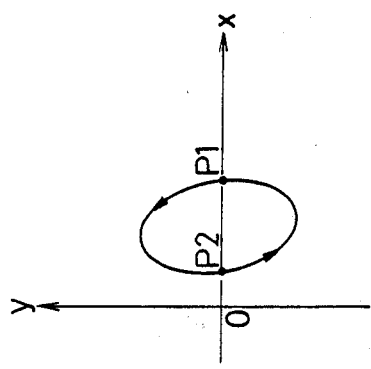
Figure 11:
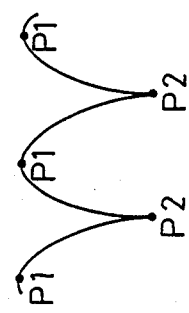

This means that the number of the sampling points of the demodulated wave of the modulation frequency fo is about 8 to 4 points. When the modulation frequency fP is higher than the modulation frequency fo, the reversal phenomenon tends to occur, but the length of time of one cycle of the demodulated waveform becomes shorter than that when the modulation frequency fP is equal to the modulation frequency fo. Therefore, the number of the sampling points encompassed during one cycle of the demodulated waveform becomes smaller than that at the modulation frequency fo. After all, at the frequency at which the reversal phenomenon seems to occur, it will be understood that the number of the sampling point encompassed in one cycle of the demodulated waveform is 7 to 8 points at maximum.

Where the result of demodulation shows the reversal phenomenon, such a result as shown in FIG. 12 or FIG. 8 will occur in which the demodulating range departs from the range of α to β (rad). However, since the number of the sampling points encompassed in one cycle of the demodulated waveform is 7 to 8 points at maximum, the number of the sampling points which lie outside the range of α to β (rad) is two points at maximum.

Where the demodulated signal is reversed to the black side such as shown in FIG. 11, or where the demodulated signal is reversed to the white side such as shown in FIG. 7, the demodulating range departs from the range of α to β (rad). Even in such case, the number of the sampling points which are outside this range of α to β (rad) is about two points at maximum by the same reason. In other words, the reason for the appearance of the black or white sweep lines on the reproduced picture being displayed on the display screen is that the discontinuity at one or two points draws the subsequent waveform towards the black or white level by the effect of de-emphasis and it has been experimentally confirmed that no discontinuity occur at any point.

By way of example, in the case of the video tape player for home use, assuming that the maximum frequency of the modulation signal is 5 MHz, the sampling frequency fs is required to be equal to or higher than 10 MHz according to the sampling theorem. In an ordinary case, it has been ascertained that the discontinuity will not substantially occur when the modulation signal is of a frequency equal to or lower than 2 MHz, but will occur when the frequency of the modulation signal is within the range of 3 to 4 MHz. Assuming that the sampling frequency fs is 14.3 MHz, the number of the sampling points encompassed during one cycle of the modulation signal of a frequency within the range of 3 to 4 MHz is 5 points at maximum. Should such a waveform as shown in FIG. 12 result in as a result of the discontinuity in demodulation, that portion which considerably jumps towards the white side at the point P2 departs from the range of α to β (rad). On the other hand, should such a waveform as shown in FIG. 8 result in as a result of discontinuity in demodulation, that portion which jumps down to the black side at the point P2 departs from the range of α to β (rad). In either case, since the number of the sampling point per cycle of the modulated signal is 5 points at maximum and, therefore, the number of the sampling points which departs from the range of α to β (rad) is one or two points and the three points or more will hardly occur as has been experimentally confirmed. Accordingly, it suffices to take into consideration the case of FIG. 22 or FIG. 29 in which the number of the sampling points which departs from the range of α to β (rad) is one and the case of FIG. 25 or FIG. 32 in which the number of such sampling points is two.

Hereinafter, the application of the present invention to the digital FM demodulator 50 shown in FIG. 14 will first be described, followed by the description of the application of the present invention to the analog FM demodulator.

The compensating operation performed by the reversal phenomenon compensator 8 used for compensating the demodulated signal of the frequency modulated wave of the type wherein the lower side-band is suppressed and the upper side-band is emphasized will first be described.

The compensation for the discontinuity in this case is carried out according to the following formulas.

When So(K)≦α or So(K)≧β, S1(K)=α, or
  otherwise S1(K)=So(K)   (4)

When S1(K−1)=α and S1(K)=α, S2(K)=γ, or
  otherwise S2(K)=S1(K)   (5)

Figure 15:
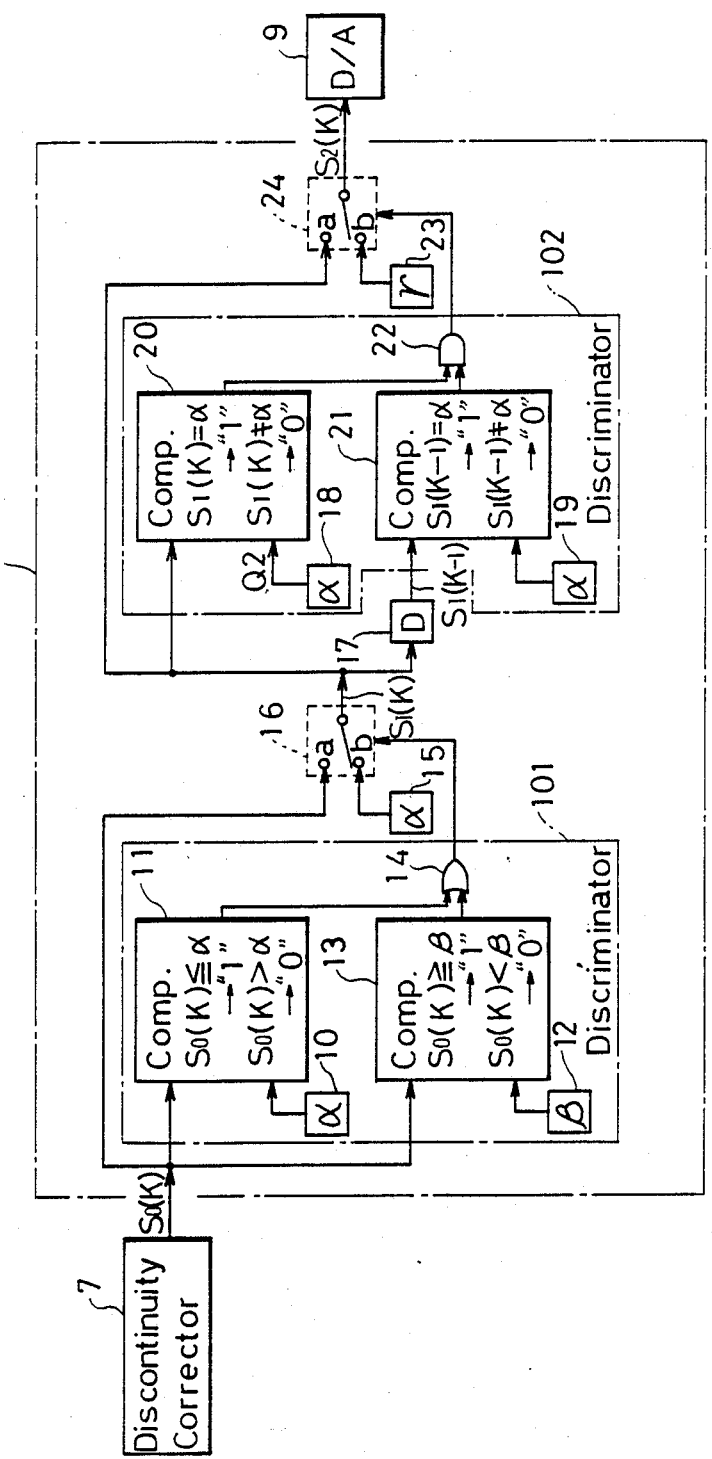
FIGS. 15, 17 and 18 are circuit block diagrams showing reversal phenomenon compensators according to different embodiments of the present invention, which are suited for use with the frequency modulated wave of a type having lower and upper side-bands suppressed and emphasized, respectively, and outputted from the digital FM demodulator.

Referring to FIG. 15, the above described compensating operation can be accomplished by the reversal phenomenon compensator 8 shown therein. More specifically, the reversal phenomenon compensator 8 shown in FIG. 15 is so designed that, when the output So(K) is supplied thereto from the discontinuity corrector 7, the reversal phenomenon compensator 8 sequentially carries out the calculation according to the formula (4) to give S1(K) and then the calculation with respect to S1(K) according to the formula (5) to give S2(K) which is, as an output from the reversal phenomenon compensator 8, supplied to the digital-to-analog converter 9. The principle of the compensating operation so performed will be described with particular reference to FIGS. 22 to 27.

Figure 22:
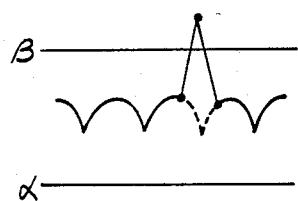
FIGS. 22 to 28 illustrate waveforms of respective demodulated signals and vectors of the frequency modulated waves for the purpose of explanation of the operation of the circuitry shown in FIG. 15.
Figure 23:
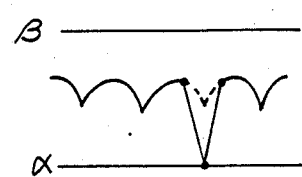
Figure 24:
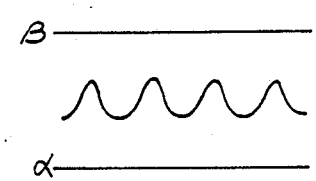

FIG. 22 illustrates the case in which only one sampling point exceeds the upper limit value β (rad). However, when the compensation according to the formulas (4) and (5) are performed subject thereto, such a result as shown in FIG. 23 can be obtained. In other words, in FIG. 23, since the sampling point having jumped to the white side as shown in FIG. 22 ought to have been in the black level, the sampling point is replaced with the lower limit value representative of the black level in the normally demodulated waveform, that is, with the value α (rad). When it is subsequently passed through the low pass band filter, it will be shaped to represent a sine wave as shown in FIG. 24.

Figure 25:
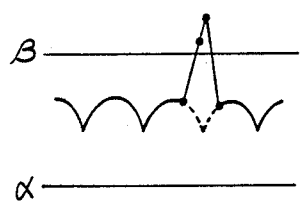
Figure 26:
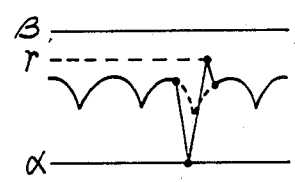
Figure 27:
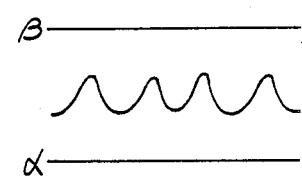

FIG. 25 illustrates the case in which the two successive points exceeds the upper limit value β (rad). However, when the compensation according to the formulas (4) and (5) are performed subject thereto, such a result as shown in FIG. 26 can be obtained. Since the discontinuous portion ought to have been in the black level, the first one of the two points is replaced with the lower limit value α (rad), but the last one of the two points is replaced with a compensated value γ which falls within the range of α to β and is chosen to be relatively close towards the upper limit value β. When it is subsequently passed through the low pass band filter, it will be shaped to represent such a waveform as shown in FIG. 27 in which the discontinuity is removed.

Figure 28:
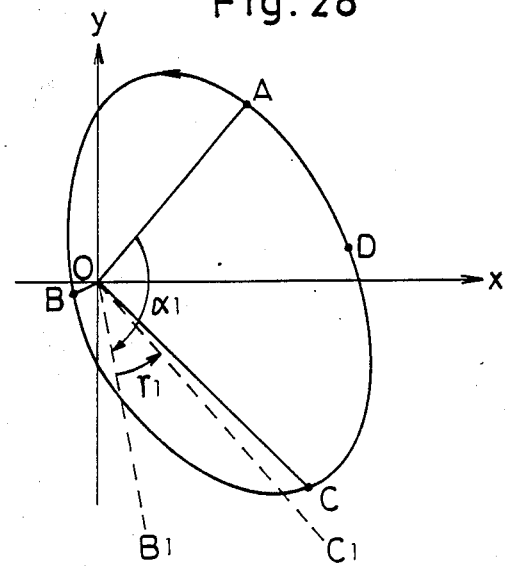

The case in which the two successive points exceed the upper limit value β such as shown in FIG. 25 will be explained with reference to the vector diagram shown in FIG. 28. As hereinbefore described, since the vector diagram is assumed as depicted on the complex plane with the carrier wave vector taken as the reference, in order to coordinate the values α, β and γ with the angle about the point of origin O in the complex plane, such respective values α1, β1 and γ1 as satisfying the following relationships have to be taken into consideration so that the values α and α1, the values β and β1 and the values γ and γ1 can be coordinated with each other.

$$\alpha1 = \alpha - 2\pi \cdot fc \cdot T$$

$$\beta1 = \beta - 2\pi \cdot fc \cdot T$$

$$\gamma1 = \gamma - 2\pi \cdot fc \cdot T$$

wherein fc represents the carrier frequency.

In the following example, the frequency fc is assumed to be the instantaneous frequency of the frequency modulated wave corresponding to the 50% white level. Therefore, from the above definitions of α and β, α1 is a negative value while β1 is a positive value. The condition in which the two successive points exceed the upper limit value β (rad) such as shown in FIG. 25 is illustrated in FIG. 28. It is assumed that the sampling point of the frequency modulated wave moves on the vector ring in a direction shown by A→B→C→D. At this time, both of <AOB (<AOB is equal to or smaller than 180°) and <BOC are greater than β1 (in a positive direction, that is, greater than |β| in a counterclockwise direction). Therefore, by the compensation expressed by the formulas (4) and (5), the point B is shifted to anywhere on $\overline{OB1}$ is incremented by α1 from $\overline{OA}$ (in a negative direction, that is, rotated clockwise by |α1|). The point C is shifted to anywhere on $\overline{OC1}$ incremented by γ1 from $\overline{OB1}$ (in a positive direction, that is rotated counterclockwise by |γ1|). At this time, γ1 should be so chosen that the error resulting from the selection of the angle <COC1 formed between $\overline{OC}$ and $\overline{OC1}$, that is, the error resulting from the shit of $\overline{OC}$ to $\overline{OC1}$ can be minimized. In other words, by the compensation according to the formulas (4) and (5), it can readily be understood that the vector trajectory corresponds to what has been changed from A→B→C→D to A→B1→C1→D (A→B1 is a shift in the counterclockwise direction.) and the point of origin O will not be encompassed with no reversal phenomenon occurring consequently.

Even in the case where the point of origin O is not encompassed and the waveform jumping considerably towards the black side as shown in FIG. 11 exceed α at the point P2, the compensation according to the formulas (4) and (5) is effective to render it to be the waveform similar to that shown in FIG. 23 when only one point is exceeded, or the waveform similar to that shown in FIG. 26 when two points are successively exceeded, and therefore, similar effects can be obtained.

The structure and the operation of the reversal phenomenon compensator 8 shown in FIG. 15, which compensator 8 is effective to perform the compensation according to the formulas (4) and (5), will now be described. Referring to FIG. 15, reference numeral 101 represents a first discriminator operable to determine if So(K) satisfies the condition of the formula (4), that is, So(K)≦α or So(K)≧β; reference numeral 102 represents a second discriminator operable to determine if S1(K−1) and S1(K) satisfy the condition of the formula (5), that is, S1(K−1)=α and S1(K)=α; and reference numerals 11, 13, 20 and 21 represent respective comparators each of which may be employed in the form of a magnitude comparator. Reference numerals 10, 15, 18 and 19 represent respective first constant generators each capable of outputting the lower limit value α (rad); reference numeral 12 represents a second constant generator capable of outputting the upper limit value β (rad); and reference numeral 23 represents a third constant generator capable of outputting a first compensation value γ (rad) which generator 23 may be comprised of a read-only memory. Reference numeral 14 represents an OR gate to which respective outputs from the comparators 11 and 13 are supplied; reference numeral 16 represents a selector adapted to be controlled by an output signal supplied from the OR gate 14; reference numeral 17 represents a delay circuit for delaying an input signal for a length of time equal to one sampling cycle T; reference numeral 22 represents an AND gate to which respective outputs from the comparators 20 and 21 are supplied; and reference numeral 24 represents a selector adapted to be controlled by an output signal supplied from the AND gate 22.

The output So(K) from the discontinuity corrector 7 is supplied to the comparators 11 and 13 and the selector 16. The comparator 11 compares the output So(K) with the output value α from the constant generator 10 and outputs a logic high level signal when So(K)≦α, or otherwise a logic low level signal. On the other hand, the comparator 13 compares the output So(K) with the output value β and outputs a logic high level signal when So(K)≧β, or otherwise a logic low level signal. The respective outputs from the comparators 11 and 13 are supplied to the OR gate 14 which outputs a logic high level signal to the selector 16, when one of the inputs to such OR gate 14 is in a logic high level state, thereby causing the selector 16 to select a terminal b to permit the output value α of the constant generator 15 to be outputted as S1(K). On the other hand, where any one of the respective outputs from the comparators 11 and 13 is in the logic low level state, the OR gate 14 outputs a logic low level signal and, accordingly, the selector 16 selects a terminal a to permit the input So(K) to be outputted as S1(K).

The output S1(K) from the selector 16 is inputted to the comparator 20, the delay circuit 17 and the selector 24. The comparator 20 compares S1(K) with the output value α from the constant generator 18 and outputs a logic high level signal when S1(K)=α, or otherwise a logic low level signal. On the other hand, the S1(K) inputted to the delay circuit 17 is delayed for a length of time equal to the sampling cycle T and, therefore, an output from the delay circuit 17 can be expressed as S1(K−1). The output S1(K−1) from the delay circuit 17 is then supplied to the comparator 21 at which it is compared with the output value α from the constant generator 19. The comparator 21 then generates a logic high level signal when S1(K−1)=α, or otherwise a logic low level signal. The AND gate 22 outputs a logic high level signal, when both of the inputs received thereby are in a logic high level state, thereby to cause the selector 24 to select a terminal b so that the compensation value γ outputted from the constant generator 23 can be outputted in the form of S2(K). Should one of the two inputs to the AND gate 22 be in a logic low level state, the AND gate 22 outputs a logic low level signal to the selector 24, causing the selector 24 to select a terminal a so that S1(K) can be outputted in the form of S2(K).

In this way, the compensation according to the formulas (4) and (5) is performed.

The compensating operation performed by the reversal phenomenon compensator 8 used for compensating the demodulated signal of the frequency modulated wave of the type wherein the upper side-band is suppressed and the lower side-band is emphasized will now be described.

The compensation in this case is carried out according to the following formulas.

When So(K)≦α or So(K)≧β, S1(K)=β, or
otherwise S1(K)=So(K)     (6)

When S1(K−1)=β and S1(K)=β, S2(K)=δ, or
otherwise S2(K)=S1(K)     (7)

Referring to FIG. 16, the reversal phenomenon compensator 8 shown therein is so designed that, when the output So(K) from the discontinuity corrector 7 is inputted thereto, the compensation according to the formula (6) can be carried out to give S1(K) and S2(K) obtained by carrying out the compensation according to the formula (7) subject to S1(K) can be outputted to the digital-to-analog converter 9 as an output of the reversal phenomenon compensator 8. The principle of the compensating operation so performed will be described with particular reference to FIGS. 29 to 34.

Figure 29:
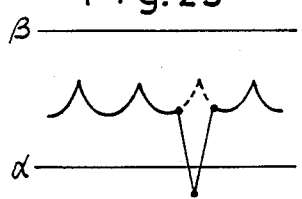
FIGS. 29 to 35 are diagrams similar to FIGS. 22 to 28, respectively, which are used to explain the operation of the circuitry shown in FIG. 16.

FIG. 29 illustrates the case in which only one sampling point exceeds the lower limit value α (rad). However, when the compensation according to the formulas (6) and (7) are performed subject thereto, such a result as shwon in FIG. 30 can be obtained. In other words, in FIG. 30, since the sampling point having jumped to the black side in FIG. 29 ought to have been in the white level, the sampling point is replaced with the upper limit value representative of the white level in the normally demodulated waveform, that is, with the value β (rad). When it is subsequently passed through the low pass band filter, it will be shaped to represent a sine wave as shown in FIG. 31.

Figure 32:
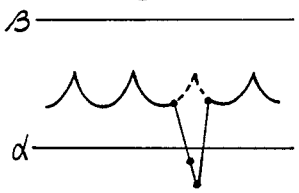
Figure 33:
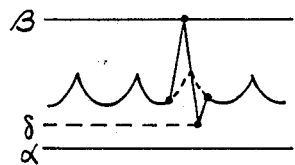
Figure 34:
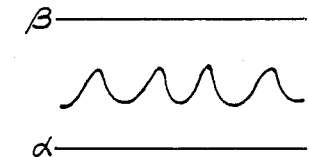

FIG. 32 illustrates the case in which the two successive points exceeds the lower limit value α (rad). However, when the compensation according to the formulas (6) and (7) are performed subject thereto, such a result as shown in FIG. 33 can be obtained. Since the discontinuous portion ought to have been in the white level, the first one of the two points is replaced with the upper limit value β (rad), but the last one of the two points is replaced with a compensated value δ which falls within the range of α to β and is chosen to be relatively close towards the lower limit value α. When it is subsequently passed through the low pass band filter, it will be shaped to represent such a waveform as shown in FIG. 34 in which the discontinuity is removed.

Figure 35:
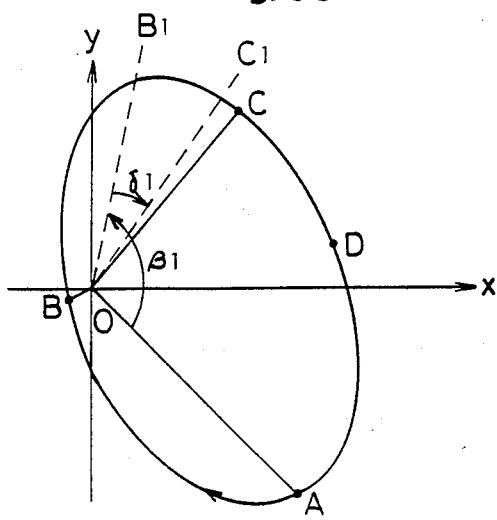

The case in which the two successive points exceed the lower limit value α such as shown in FIG. 32 will be explained with reference to the vector diagram shown in FIG. 35. As hereinbefore described, since the vector diagram is assumed as depicted on the complex plane with the carrier wave vector taken as the reference, in order to coordinate the values α, β and δ with the angle about the point of origin 0 in the complex plane, such respective values α1, β1 and δ1 as satisfying the following relationships have to be taken into consideration so that the values α and α1, the values β and β1 and the values δ and δ1 can be coordinated with each other.

$$\alpha 1 = \alpha - 2\pi \cdot fc \cdot T$$

$$\beta 1 = \beta - 2\pi \cdot fc \cdot T$$

$$\delta 1 = \delta - 2\pi \cdot fc \cdot T$$

wherein fc represents the carrier frequency.

In the following example, the frequency fc is assumed to be the instantaneous frequency of the frequency modulated wave corresponding to the 50% white level. Therefore, from the above definitions of α and β, α1 is a negative value while β1 is a positive value. The condition in which the two successive points exceed the range of α to β (rad) such as shown in FIG. 32 is illustrated in FIG. 35. It is assumed that the sampling point of the frequency modulated wave moves on the vector ring in a direction shown by A→B→C→D. At this time, both of <A0B and <B0C are smaller than α1 (greater than |α1| in a negative direction, that is, in a counterclockwise direction). Therefore, by the compensation expressed by the formulas (6) and (7), the point B is shifted to anywhere on $\overline{OB1}$ incremented by β1 from $\overline{OA}$ (in a positive direction, that is, rotated counterclockwise by |β1|). The point C is shifted to anywhere on $\overline{OC1}$ incremented by δ1 from $\overline{OB1}$ (in a negative direction, that is rotated clockwise by |δ1|). At this time, δ1 should be so chosen that the error resulting from the selection of the angle <C0C1 formed between $\overline{OC}$ and $\overline{OC1}$, that is, the error resulting from the shift of $\overline{OC}$ to $\overline{OC1}$ can be minimized. In other words, by the compensation according to the formulas (6) and (7), it can readily be understood that the vector trajectory corresponds to what has been changed form A→B→C→D to A→B1→C1→D (A→B1 is a shift in the counterclockwise direction.) and the point of origin 0 will not be encompassed with no reversal phenomenon occurring consequently.

Figure 30:
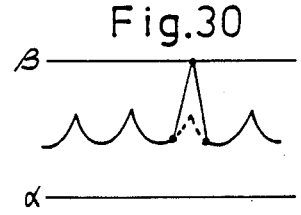
Figure 31:
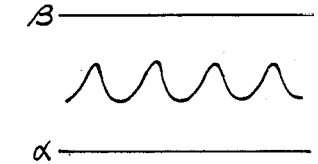

Even in the case where the point of origin 0 is not encompassed and the waveform jumping considerably towards the white side as shown in FIG. 7 exceed the upper limit value β1 at the point P2, the compensation according to the formulas (6) and (7) is effective to render it to be the waveform similar to that shown in FIG. 30 when only one point is exceeded, or the waveform similar to that shown in FIG. 33 when two points are successively exceeded, and therefore, similar effects can be obtained.

The structure of the reversal phenomenon compensator 8 shown in FIG. 16, which compensator 8 is effective to perform the compensation according to the formulas (6) and (7), will now be described. However, it is to be noted that, for the sake of brevity, the components shown in FIG. 16 which are like those shown in FIG. 15 will not be reiterated. In FIG. 16, reference numerals 25, 26 and 27 represent respective second constant generators each capable of outputting the upper limit value β (rad); reference numerals 28 and 29 represent respective comparators; reference numeral 30 represents a fourth constant generator capable of generating the compensation value δ (rad); and reference numeral 103 represents a third discriminator operable to determine if S1(K) and S1(K−1) satisfy the condition of the formula (7), that is, S1(K−1)=β and S1(K)=β.

The reversal phenomenon compensator 8 according to the embodiment shown in FIG. 16 operates in a manner generally similar to that shown in and described with reference to FIG. 15, except for the following difference.

The selector 16, when the logic high level signal is supplied thereto from the OR gate 14, selects the terminal b to cause the output value β of the constant generator 25 to be outputted in the form of S1(K). Then, the comparator 28 compares S1(K) so inputted with the output value β of the constant generator 26 and outputs a logic high level signal when S1(K)=β, or otherwise a logic low level signal. On the other hand, the signal which has been inputted to the delay circuit 17 and has therefore been delayed a length of time equal to the sampling cycle T, that is, the output S1(K−1) from the delay circuit 17 is inputted to the comparator 29 at which it is compared with the output value β from the constant generator 27. The comparator 29 outputs a logic high level signal when S1(K−1)=β, or otherwise a logic low level signal. The AND gate 22, when the two inputs applied thereto are in a logic high level state, outputs a logic high level signal which is in turn supplied to the selector 24 causing the latter to select the terminal b so that the output value δ from the constant generator 30 can be outputted in the form of S2(K). On the other hand, should one of the two inputs supplied to the AND gate 22 be in a logic low level state, the AND gate 22 outputs a logic low level signal to cause the selector 24 to select the terminal a so that S1(K) can be outputted in the form of S2(K). In this way, the compensation according to the formulas (6) and (7) is performed.

Figure 17:
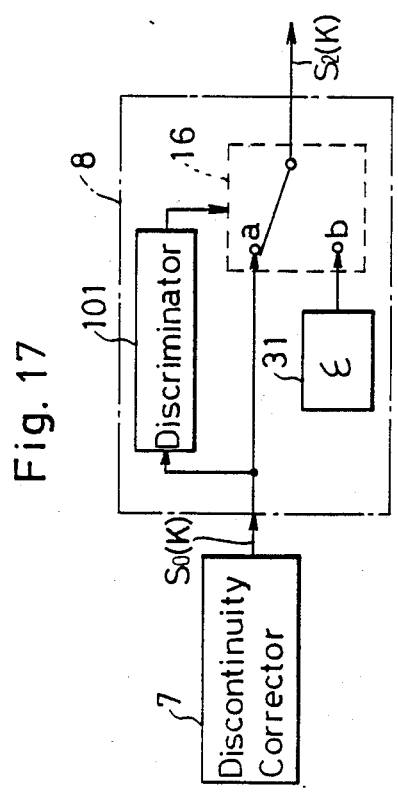

FIG. 17 illustrates a block circuit diagram of one embodiment of the reversal phenomenon compensator 8 which can be used in demodulating the frequency modulated wave of the type wherein the lower side-band is suppressed and the upper side-band is emphasized. In FIG. 17, reference numeral 101 represents the discriminator operable to discriminate the formulas (4) and (5); reference numeral 31 represents a constant generator operable to generate a compensation value ε (rad); and reference numeral 16 represents the selector.

The operation of the embodiment shown in FIG. 17 will now be described separately according to various cases.

As a first example, the case in which the increment of the true phase of the frequency modulated wave which has not resulted in the reversal phenomenon takes a negative value will first be discussed.

Assuming that the output φ(K−1) from the calculating circuit 4, shown in FIG. 14, at the timing (K−1) is, for example, 0.5π and the output φ(k) thereof at the subsequent timing K is 0.4π (that is, the increment of the true phase of the frequency modulated wave is negative), the output Δφ(K) from the subtractor 6 at the timing K will be −0.1π (rad) [=Δφ(K)−φ(K−1)], which is a negative value, and therefore, 2π is added thereto by the discontinuity corrector 7 and the output So(K) from the discontinuity corrector 7 becomes 1.9π which deviates from the range of α to β (rad) and which is an abnormally large value. This value is in turn inputted to the reversal phenomenon compensator 8. Accordingly, in such case, the value obtained by subtracting 2π from So(K), rather than So(K) itself, appears to be approximate to the increment of the true phase of the frequency modulated wave. However, since the lower limit value of the increment of the phase can be considered to be α (rad), it appears proper to employ, as a demodulated output, one of the value of So(K)−2π and the value α (rad) which is greater than the other. The compensation value ε (rad) is in practice chosen in consideration of the following to be a value in the vicinity of α (rad). In other words, if the compensation value ε is too small, the waveform in the vicinity of a portion where the reversal phenomenon compensation is desired to be effected will be drawn downwardly when the signal is passed through the low pass band filter and the main de-emphasis circuit and, on the other hand, if the compensation value ε is too large, the same will be drawn upwardly. Accordingly, the compensation value ε is to be chosen a value about equal to α (rad). Nevertheless, as a result of this choice, it may happen to be appropriate to chose the compensation value ε to be equal to α. Thus, the compensation value ε is a value about equal to the value containing α (rad), but higher than α (rad).

As a second example, the case in which the increment of the true phase of the frequency modulated wave which has not resulted in the reversal phenomenon does not take a negative value, but takes a value about equal to 0 (rad) will now be discussed.

Assuming that the output φ(K−1) from the calculating circuit 4 at the timing (K−1) is, for example, 0.5π and φ(K) becomes 0.6π (rad) because the increment of the true phase of the frequency modulated wave is increased by 0.1π, the output Δφ(K) from the subtractor 6 will be 0.1π (rad) [=φ(K)−φ(K−1)] and take an abnormally small value having deviated from the range of α to β (rad). It is, however, to be noted that, since the output 0.1π (rad) from the subtractor 6 is not a negative value, the output So(K)=0.1π (rad) is, without being corrected by the discontinuity corrector 7, inputted to the reversal phenomenon compensator 8. In this case, it is proper to employ the value ε as a demodulated output.

As a third example, the case in which the increment of the true phase of the frequency modulated wave exceeds 2π (rad) because of the occurrence of the reversal phenomenon to the white side will now be discussed.

According to a result of a series of experiments conducted, even though the increment of the true phase of the frequency modulated wave exceeds 2π (rad), the amount thereof in excess of 2π (rad) is small in most cases. As hereinbefore discussed, the considerable excess of the increment of the true phase of the frequency modulated wave over 2π (rad) and to, for example, 3π (rad) seldom occurs. Therefore, considering that the increment of the true phase becomes 2.1π (rad) when, for example, φ(K−1) is 1.0π (rad), the true φ(K) will as a result thereof become 3.1π (rad), but since the value within the range of 0 to 2π (rad) is allocated in the calculating circuit 4, φ(K) will be recognized as 1.1π (rad) and, therefore, as the output Δφ(K) from the subtractor 6, φ(K)−φ(K−1)=1.1π 1.0π−0.1π (rad) can be outputted.

Since this value is not a negative value, the output So(K)=0.1π (rad) is, without being corrected by the discontinuity corrector 7, inputted to the reversal phenomenon compensator 8. In such case, since the demodulated data So(K) which ought to be demodulated as the black level is reversed to the white side and, therefore, takes a smaller value than α (rad), it is proper to employ for the demodulated output a value about equal to the lower limit value α (rad) which is considered as a normal black level, that is, the previously described value ε (rad).

As a fourth example, the case in which as a result of the occurrence of the reversal phenomenon to the white side the increment of the true phase of the frequency modulated wave does not exceeds 2π (rad), but takes a value in the vicinity of 2π (rad), for example, 1.9π (rad) will now be discussed.

Assuming that, as a result that the increment of the true phase is 1.9π (rad) when the output φ(K−1) from the circulating circuit 4 is, for example, 1.0π, the true φ(K) becomes 2.9π (rad), φ(K) will be recognized as 0.9π (rad) in the calculating circuit 4 by the reason as hereinbefore described and, therefore, as the output Δφ(K) from the subtractor 6, Δφ(K)=φ(K)−φ(K−1)=0.9π−1.0π=−π (rad) is outputted. Since this is a negative value, 2π is added thereto by the discontinuity corrector 7 to provide So(K)=−0.1π+2π=1.9π (rad), that is, the value exceeding the upper limit value of the normal demodulating range of α to β which is in turn inputted to the reversal phenomenon compensator 8.

In such case, since the demodulated data So(K) which ought to be demodulated as the black level is reversed to the white side and, therefore, takes the value exceeding β (rad), it is proper to employ for the demodulated output a value about equal to the lower limit value α (rad) which is considered as a normal black level, that is, the previously described value ε (rad).

As hereinbefore discussed, if the output from the reversal phenomenon compensator 8 is expressed by S2(k), the compensation is performed to the input signal So(K) according to the following formulas.

When So(K)≦α, S2(K)=ε,

When So(K) β, S2(K)=ε,

If α<So(K)<β, S2(K)=So(K)  (8)

Figure 18:
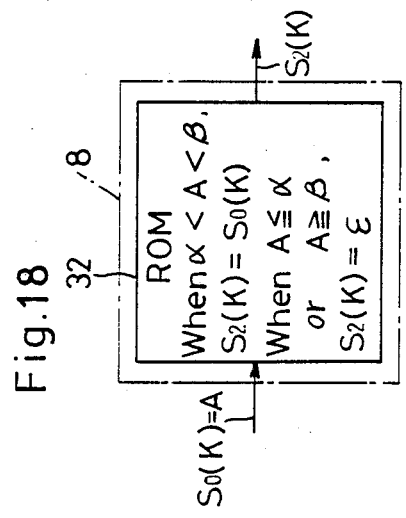

FIG. 18 illustrates the example in which the reversal phenomenon compensator 8 shown in FIG. 17 is constituted by a read-only memory 32. In this embodiment, the output So(K) from the discontinuity corrector 7 is specified as an address A inputted to the read-only memory 32. This read-only memory 32 stores such a table that, so far as the address A is within the range of α<A<β, the content of the read-only memory 32 can be rendered in conformity with So(K) and the contents of the read-only memory 32 for the range of the address A such as A≦α or α≧β are rendered to be ε. Even with the use of the read-only memory 32 for the reversal phenomenon compensator, it can operate in a manner, and give effects, similar to those exhibited by the arrangement of FIG. 17.

Figure 19:
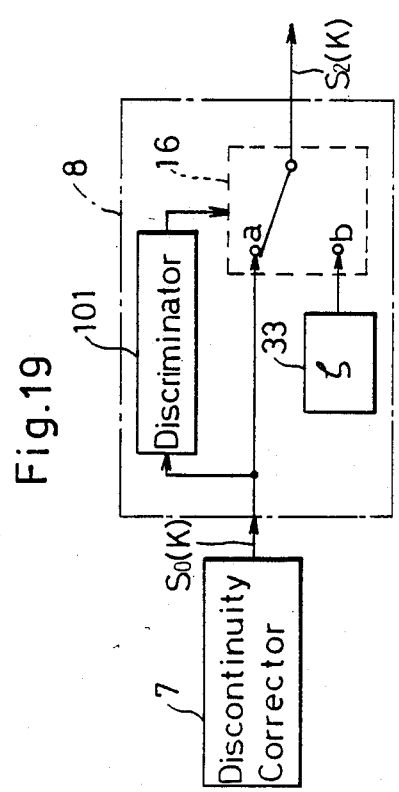

FIG. 19 illustrates a block circuit diagram of one embodiment of the reversal phenomenon compensator 8 which can be used in demodulating the frequency modulated wave of the type wherein the upper side-band is suppressed and the lower side-band is emphasized. In FIG. 19, reference numeral 101 represents the discriminator operable to discriminate the formulas (6) and (7); reference numeral 33 represents a constant generator operable to generate a compensation value ζ (rad); and reference numeral 16 represents the selector.

The operation of the embodiment shown in FIG. 19 will now be described separately according to various cases.

As a first example, where the increment of the true phase of the frequency modulated wave which has not resulted in the reversal phenomenon exceeds by $2\pi$ (rad), for example, where $\phi(K)$ is $2.6\pi$ and $\phi(K-1)$ is $0.5\pi$, $\Delta\phi(K)$ becomes $0.1\pi$ (rad) $[=\phi(K)-\phi(K-1)]$ because $\phi(K-1)$ is recognized as $0.6\pi$ in the calculating circuit 4 of FIG. 14. This value $0.1\pi$ deviates from the normal demodulating range of $\alpha$ to $\beta$ and takes an abnormally small value. In such case, since the output $0.1\pi$ from the subtractor 6 is not a negative value, $So(K)=0.1\pi$ is inputted to the reversal phenomenon compensator 8 without being corrected by the discontinuity corrector 7. In such case, since the demodulating data So(K) which ought to be demodulated as the white level becomes a small value lowering $\alpha$ (rad), the value obtained by adding $2\pi$ (rad) to So(K), rather than So(K) itself, can be considered approximating to the increment of the true phase of the frequency modulated wave. However, since the upper limit value of the increment of the phase is considered to be $\beta$ (rad), it is considered appropriate to employ, for the demodulating output (the actual increment of the phase) in such case, one of the value of $So(K)+2\pi$ (rad) and $\beta$ (rad) which is smaller than the other.

The compensation value $\zeta$ in this case is in practice selected in consideration of the following to be a value about equal to $\beta$ (rad).

In other words, if the compensation value $\zeta$ is too large, the waveform in the vicinity of a portion where the reversal phenomenon compensation is desired to be effected will be drawn upwardly when the signal is passed through the low pass band filter and the main de-emphasis circuit and, on the other hand, if the compensation value $\zeta$ is too small, the same will be drawn downwardly. Accordingly, the compensation value $\zeta$ is to be chosen a value about equal to $\beta$ (rad). Nevertheless, as a result of this choice, it may happen to be appropriate to chose the compensation value $\zeta$ to be equal to $\beta$. Thus, the compensation value $\zeta$ is a value about equal to the value containing $\beta$ (rad), but smaller than $\beta$ (rad).

As a second example, where the increment of the true phase of the frequency modulated wave does not exceed $2\pi$ (rad) but attains a value about equal to $2\pi$ (rad), for example, where $\Delta\phi(K-1)$ is $0.5\pi$ and $\phi(K)$ is $2.4\pi$ (that is, the increment of the true phase is $1.9\pi$), $\Delta\phi(K)$ becomes $-0.1\pi$ (rad) $[=\phi(K)-\phi(K-1)]$ because $\phi(K-1)$ recognized as $0.4\pi$ $(=2.4\pi-2.0\pi)$, $2\pi$ (rad) is added thereto by the discontinuity corrector 7 so as to result in $So(K)=1.9\pi$ (rad) which is a large value exceeding the range of $\alpha$ to $\beta$. In such case, since the demodulating data So(K) which ought to be demodulated as the black level takes a large value exceeding $\beta$(rad), it is proper to employ the previously described $\zeta$ (rad) for the demodulated output.

In a third example, where the increment of the true phase of the frequency modulated wave does not exceed $2\pi$ (rad), but attains a value about equal to $2\pi$ (rad), for example, where $\phi(K)$ is $1.9\pi$ when $\phi(K-1)$ is $0.1\pi$ and the increment of the true phase is $1.8\pi$, the output $\Delta\phi(K)$ from the subtractor 6 becomes $1.8\pi$ (rad) $[=\phi(K)-\phi(K-1)]$. Since this value is not a negative value, $So(K)=1.8\pi$ (rad) is, without being corrected by the discontinuity corrector 7, inputted to the reversal phenomenon compensator 8. Even in this case, the output So(K) from the discontinuity corrector 7 becomes a large value exceeding the normal demodulating range of $\alpha$ to $\beta$ (rad). In such case, since the demodulating data So(K) which ought to be demodulated as the black level takes the value exceeding $\beta$ (rad), it is proper to employ the previously described $\zeta$ (rad) for the demodulated output.

As a fourth example, the case in which as a result of the occurrence of the reversal phenomenon to the black side the increment of the true phase of the frequency modulated wave takes a negative value, for example, $\phi(K)$ becomes $0.9\pi$ (rad) when $\phi(K-1)$ is $1.0\pi$ (rad) and $\Delta\phi(K)$ becomes $-0.1\pi$ (rad) $[=\phi(K)-\phi(K-1)]$ will now be discussed.

According to a result of experiments conducted, although $\Delta\phi(K)$ is of a negative value, the absolute value thereof, that is, $|\Delta\phi(K)|=-\Delta\phi(K)$, is very small and, accordingly, more often it satisfies the following formula.

$$-\Delta(K) < 2\pi - \beta \text{ (rad)} \tag{9}$$

In view of this, the output $So(K)=2\pi+\Delta\phi(K)$ from the discontinuity corrector 7 based on such $\Delta\phi(K)$ will be, in most cases, greater than $\beta$ (rad) according to the formula (9). However, in such case, since as a result of the reversal phenomenon to the black side occurring in the demodulating data So(K) which ought to be the white level of about $\beta$ (rad) it takes a value large enough to exceed $\beta$ (rad), it is appropriate to employ for the demodulated output a value about equal to $\beta$ (rad), that is, the previously described value $\zeta$ (rad).

In a fifth example, the case in which as a result of the occurrence of the reversal phenomenon to the black side the increment of the true phase of the frequency modulated wave takes a positive value, but a very small value, for example, $\Delta\phi(K)$ becomes $0.1\pi$ (rad) will now be discussed. In such a case, since as a result of the reversal phenomenon to the black side occurring in the demodulating data So(K) which ought to be the white level of about $\beta$ (rad) it appears that it takes the very small value which is smaller than $\alpha$ (rad) and, therefore, it is appropriate to employ the previously described value $\zeta$ (rad) for the demodulated output.

As hereinbefore discussed, if the output from the reversal phenomenon compensator 8 is expressed by S2(K), the selection is performed to the input signal So(K) according to the following formulas.

When $So(K) \leq \alpha$, $S2(K)=\zeta$,
When $So(K) \geq \beta$, $S2(K)=\zeta$,
If $\alpha < So(K) < \beta$, $S2(K)=So(K)$ (10)

Figure 20:
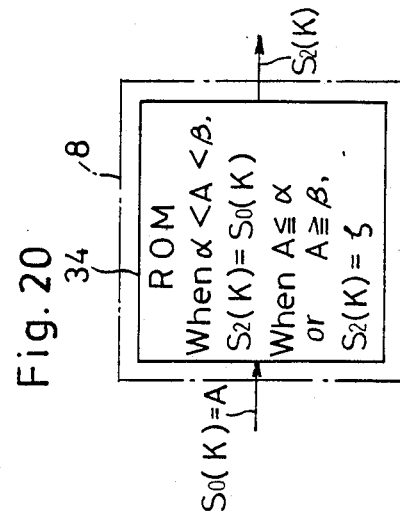

FIG. 20 illustrates the example in which the reversal phenomenon compensator 8 shown in FIG. 19 is constituted by a read-only memory 34. In this embodiment, the output So(K) from the discontinuity corrector 7 is specified as an address A. This read-only memory 34 stores such a table that, so far as the address A is within the range of $\alpha < A < \beta$, the content of the read-only memory 34 can be rendered in conformity with So(K) and the contents of the read-only memory 34 for the range of the address A such as $A \leq \alpha$ or $A \geq \beta$ are rendered to be $\zeta$. Even with the use of the read-only memory 34 for the reversal phenomenon compensator, it can operate in a manner, and give effects, similar to those exhibited by the arrangement of FIG. 19.

Figure 1:
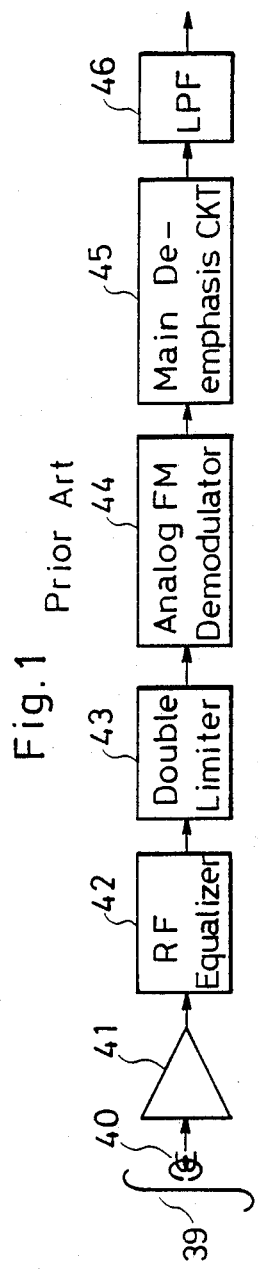
FIG. 1 is a circuit block diagram showing a reproduced luminance signal processing circuit used in the video tape player.
Figure 2:
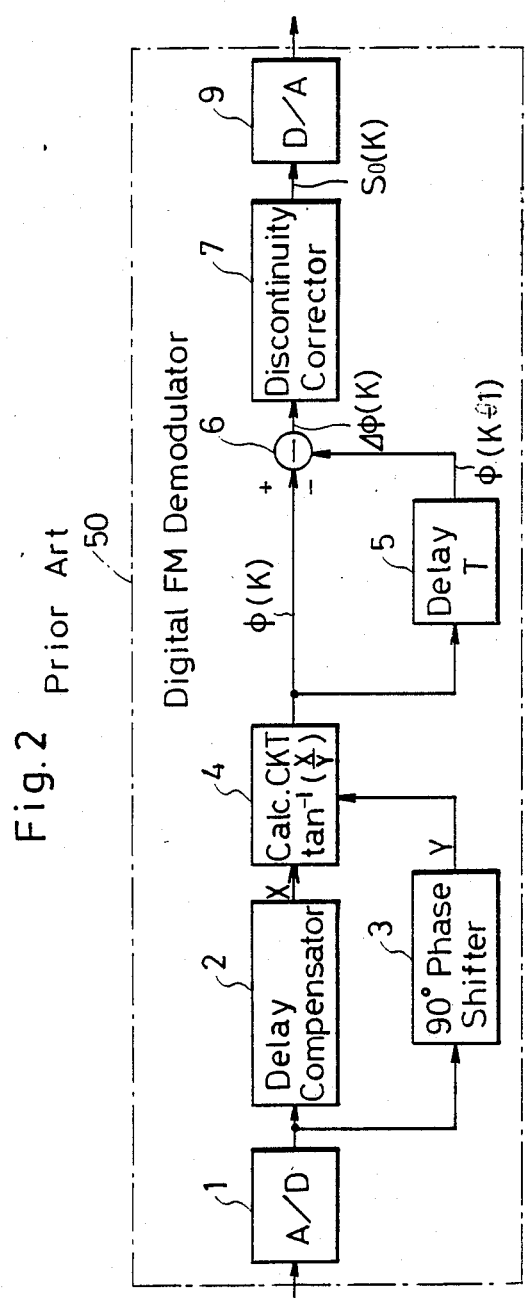
FIG. 2 is a circuit block diagram showing the prior art digital FM demodulator.
Figure 3:
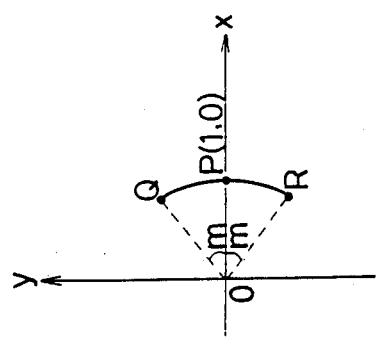
FIGS. 3 to 12 are diagrams showing respective vector trajectories of a frequency modulated wave and respective waveforms of a demodulated signal, which are used for the purpose of discussing the reversal phenomenon occurring in the demodulated signal of the reproduced FM luminance signal.
Figure 4:
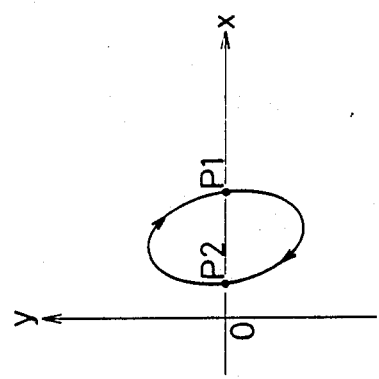
Figure 5:
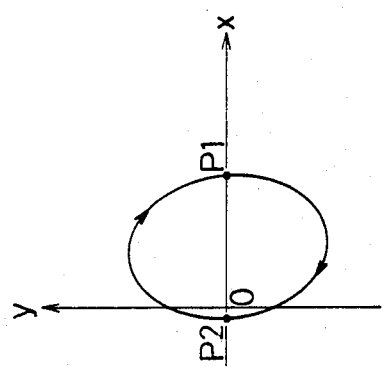
Figure 6:
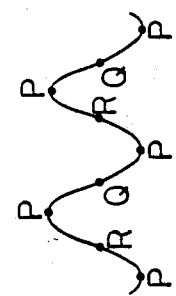

The reversal phenomenon compensator 8 of the construction shown in and described with reference to any one of FIGS. 15 to 20 can be equally applicable by converting the demodulated signal outputted from the analog FM demodulator 44 shown in FIG. 1 into the digital signal.

FIG. 13 illustrates a circuit block diagram of the luminanace signal processing circuit used in the reproduction system of the video tape player provided with the reversal phenomenon compensator 8 according to the present invention. In FIG. 13, parts alike those shown in FIG. 1 are designated by like reference numeral used in FIG. 1 and, therefore, the description thereof will not be reiterated, except for the following differences. Referring now to FIG. 13, reference numeral 46 represents a low pass filter for removing an unnecessary component of the analog demodulated signal inputted from the analog FM demodulator 44; reference numeral 47 represents an analog-to-digital converter having a sampling cycle T and operable to convert the analog demodulated signal, inputted from the low pass filter 46, into a digital signal; reference numeral 8 represents the reversal phenomenon compensator; reference numeral 48 represents a digital-to-analog converter operable to convert the output from the reversal phenomenon compensator 8 into an analog signal; and reference numeral 49 represents a low pass filter operable to remove an unnecessary component of the analog demodulated signal inputted from the digital-to-analog converter 48.

Figure 21:
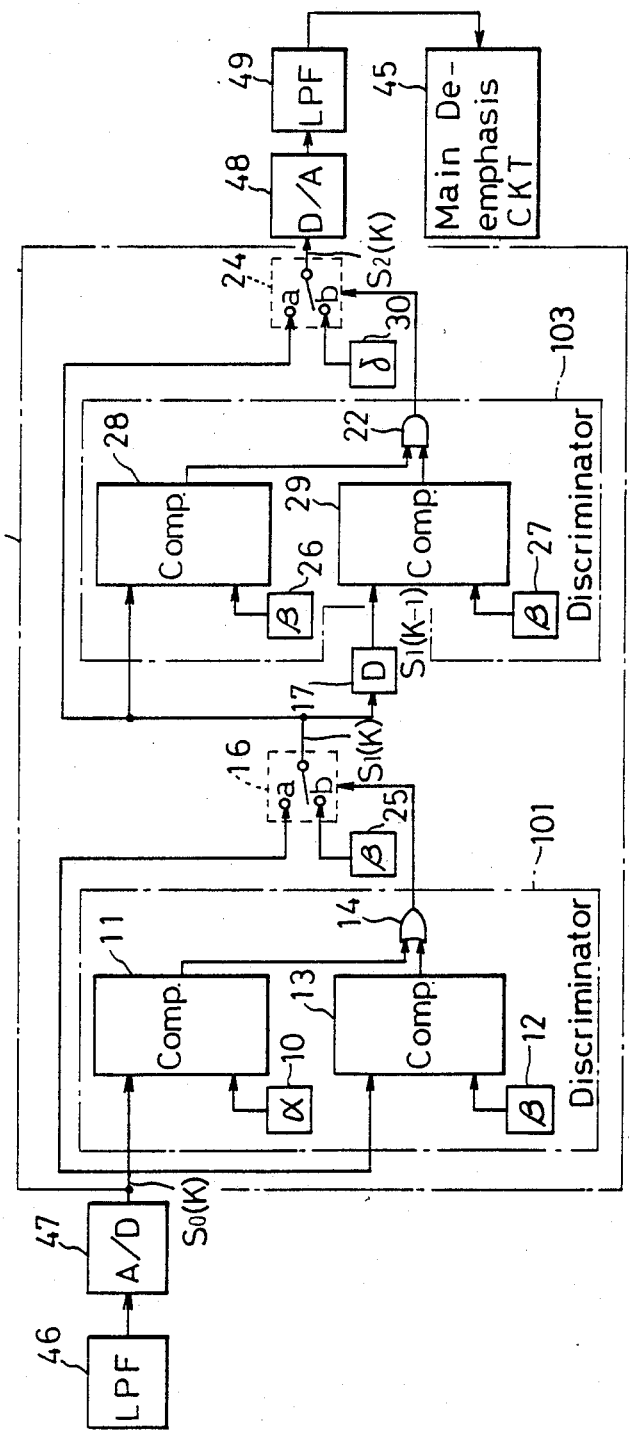
FIG. 21 is a circuit block diagram showing a reversal phenomenon compensator according to a still further embodiment of the present invention, which is suited for use with the frequency modulated wave of a type having upper and lower side-bands suppressed and emphasized, respectively, and outputted from the analog FM demodulator.

FIG. 21 illustrates a block circuit diagram showing the application of the reversal phenomenon compensator 8 of the construction shown in FIG. 16 to the analog FM demodulator for demodulating the frequency modulated wave of the type wherein the upper and lower side-bands are suppressed and emphasized, respectively. In this block circuit diagram, parts alike those shown in FIGS. 13 and 16 are designated by like reference numerals used in FIGS. 13 and 16.

In the case of the video tape player for home use, the maximum value f1 and the minimum value f2 of the instantaneous frequency of the frequency modulated signal is fixed according to the frequency allocation of the frequency modulated signal as hereinbefore discussed. Accordingly, if the frequency modulated wave is reproduced in the same way as that during the recording mode, the level of the analog demodulated signal relative to the maximum and minimum values f1 and f2 can be theoretically determined according to the wave detecting characteristic of the analog FM demodulator.

The maximum level of the value obtained by sampling the analog demodulated signal, outputted from the low pass filter 46, at the timing (k) is a demodulating level $\iota 1$ corresponding to the frequency f1 and the minimum level thereof is a demodulating level $\iota 2$ corresponding to the frequency f2. It may be said that the demodulating level $\iota 1$ corresponds to $So^B$ (rad) of the output So(K) from the discontinuity corrector 7 in the digital FM demodulator 50, whereas the demodulating level $\iota 2$ corresponds to $So^A$ of the output So(K) from the discontinuity corrector 7. therefore, in order to make the embodiment of FIG. 21 coincide with the respective embodiments of FIGS. 15 to 20, the sampling value is expressed by So(K) and it is also assumed that the various values, $\alpha$, $\beta$, $\gamma$, $\delta$, $\epsilon$ and $\zeta$ are set to their counterpart values.

Since the compensating operation according to this embodiment is carried out according to the previously described formulas (6) and (7), the details thereof will not be reiterated for the sake of brevity, however, it is to be noted that the analog demodulated signal outputted from the low pass filter 49 can assume a demodulated signal similar to that in the embodiment of FIG. 16 in which the reversal phenomenon is suppressed.

With respect to the analog demodulated signal of the frequency modulated wave of the type wherein the lower and upper side-bands are suppressed and emphasized, respectively, the reversal phenomenon compensator of the construction shown in FIG. 15 can be used in the reversal phenomenon compensator 8, in which case the compensating operation is carried out according to the previously described formulas (4) and (5).

Moreover, with respect to the analog demodulated signal of the frequency modulated wave of the type wherein the lower and upper side-bands are suppressed and emphasized, respectively, the reversal phenomenon compensator 8 of the construction shown in and described with reference to any one of FIGS. 17 and 18 can also be employed. On the other hand, with respect to the analog demodulated signal of the frequency modulated wave of the type wherein the upper and lower side-bands are suppressed and emphasized, respectively, the reversal phenomenon compensator 8 of the construction shown in and described with reference to any one of FIGS. 19 and 20 can also be effectively used to give similar effects.

According to the present invention, as hereinbefore fully described, the design has been made so that, when the demodulated output deviates from the normal demodulating range, the demodulated output can be replaced with a level in which no reversal phenomenon occurs. Therefore, the demodulated output of the level within the normal demodulating range can be obtained at all times so that the pictures being reproduced on the display screen are substantially free from the appearance of the black or white sweep lines, making them comfortable to view.

Although the present invention has fully been described in connection with the preferred embodiments thereof with reference to the accompanying drawings used only for the purpose of illustration, those skilled in the art will readily conceive numerous changes and modifications within the framework of obviousness upon the reading of the specification herein presented of the present invention. By way of example, while in the foregoing embodiments the range in which the reversal phenomenon is compensated has been described as within the range of $\alpha$ to $\beta$ (rad) and the compensation values are chosen to be $\alpha$, $\beta$, $\gamma$, $\delta$, $\epsilon$ and $\zeta$, these values are in practice to be chosen to respective values appropriate to $S^A$ and $S^B$ which are determined according to the frequency allocation of the frequency modulated wave and the sampling frequency, both determined according to the recording and/or reproducing system of the video tape player, and the stability of the reproduced frequency modulated wave.

Also, each of the constant generators may be constituted not only by the read-only memory, but also by a digital memory, and may be so designed that the respective preset value can be supplied thereto by means of a data setting switch.

Accordingly, such changes and modifications are, unless they depart from the spirit and scope of the present invention as delivered from the claims annexed hereto, to be construed as included therein.

What is claimed is:

1. A frequency demodulator which comprises:
digital FM demodulating means for demodulating an inputted FM signal and outputting a digital demodulated signal; and reversal phenomenon compensation means adapted to receive the digital demodulated signal and operable to output the digital demodulated signal when such digital demodulated signal is within the range of $\alpha$ to $\beta$ which range is considered a normal demodulating range, and also to output a compensated digital demodulated signal after the signal has been replaced with a predetermined compensation value set to be within the normal demodulating range when the digital demodulated signal deviates from the normal demodulating range.

2. A frequency demodulator as claimed in claim 1, wherein the digital FM demodulating means comprises an analog FM demodulator and an analog-to-digital converter.

3. A frequency demodulator as claimed in claim 1, wherein the digital FM demodulating means comprises:
   an analog-to-digital converter for converting the inputted FM signal into a digital signal;
   a 90° phase shifter for shifting 90° the phase of the converted digital signal;
   a calculating circuit for performing a calculation of $\tan^{-1}(X/Y)$ wherein X represents the output from the analog-to-digital converter and Y represents an output from the 90° phase shifter;
   a delay circuit for delaying an output from the calculating circuit for a period of time equal to one sampling cycle T;
   a subtractor for subtracting an output of the delay circuit from the output of the calculating circuit; and
   a discontinuity corrector for correcting the discontinuity of an output from the subtractor.

4. A frequency demodulator as claimed in claim 1, wherein when the inputted FM signal is of a type having lower and upper side-bands suppressed and emphasized, respectively, the compensation value is chosen to be a value $\epsilon$ which is in the vicinity of the lower limit value $\alpha$.

5. A frequency demodulator as claimed in claim 1, wherein when the inputted FM signal is of a type having the upper and lower side-bands suppressed and emphasized, respectively, the compensation value is chosen to be a value $\zeta$ which is in the vicinity of the upper limit value $\beta$.

6. A frequency demodulator as claimed in claim 1, wherein when the inputted FM signal is of a type having lower and upper side-bands suppressed and emphasized, respectively, and in the event that the digital demodulated signal outputted from the digital FM demodulating means has only one point deviating from the normal demodulating range, the compensation value is chosen to be the lower limit value $\alpha$, and in the event that the digital demodulated signal has two points successively deviating in the same direction from the normal demodulating range, the compensation value for the first point is chosen to be the lower limit value $\alpha$ and the compensation value for the second point is chosen to be a value $\gamma$ smaller than the upper limit value $\beta$ and in the vicinity of the upper limit value $\beta$.

7. A frequency demodulator as claimed in claim 1, wherein when the inputted FM signal is of a type having upper and lower side-bands suppressed and emphasized, respectively, and in the event that the digital demodulated signal outputted from the digital FM demodulating means has only one point deviating from the normal demodulating range, the compensation value is chosen to be the upper limit value $\beta$, and in the event that the digital demodulated signal has two points successively deviating in the same direction from the normal demodulating range, the compensation value for the first point is chosen to be the upper limit value $\beta$ and the compensation value for the second point is chosen to be a value $\delta$ larger than the lower limit value $\alpha$ and in the vicinity of the lower limit value $\alpha$.

8. A frequency demodulator as claimed in claim 4, wherein the reversal phenomenon compensation means comprises:
   a discriminator means adapted to receive the digital demodulated signal, which has been obtained in the digital FM demodulating means by demodulating the FM signal of the type having the lower and upper side-bands suppressed and emphasized, respectively, and operable to discriminate whether or not the level of the digital demodulated signal deviates from the normal demodulating range of $\alpha$ to $\beta$; and
   a constant generator means for outputting a compensation value $\epsilon$ (rad) which is set to be in the vicinity of the lower limit value $\alpha$ (rad) of the normal demodulating range; and
   a selector means for selecting the digital demodulated signal in the event that a result of discrimination performed by the discriminator means is within the normal demodulating range and for selecting the compensation value $\epsilon$ (rad) in the event that the result of the discrimination deviates from the normal demodulating range.

9. A frequency demodulator as claimed in claim 4, wherein the reversal phenomenon compensation means comprises a memory means having an input address represented by the digital demodulated signal obtained in the digital FM demodulating means by demodulating the FM signal of the type having the lower and upper side-bands suppressed and emphasized, respectively, said memory means having a content which is equal to the input address when the input address in within the normal demodulating range of $\alpha$ to $\beta$, but which is a compensation value $\epsilon$ set in the vicinity of the lower limit value $\alpha$ of the normal demodulating range when the input address deviates from the normal demodulating range of $\alpha$ to $\beta$.

10. A frequency demodulator as claimed in claim 5, wherein the reversal phenomenon compensation means comprises:
    a discriminator means adapted to receive the digital demodulated signal, which has been obtained in the digital FM demodulating means by demodulating the FM signal of the type having the upper and lower side-bands suppressed and emphasized, respectively, and operable to discriminate whether or not the level of the digital demodulated signal deviates from the normal demodulating range of $\alpha$ to $\beta$;
    a constant generator means for outputting a compensation value $\zeta$ which is set to be in the vicinity of the upper limit value $\beta$ of the normal demodulating range; and
    a selector means for selecting the digital demodulated signal in the event that a result of discrimination performed by the discriminator means is within the normal demodulating range and for selecting the compensation value $\zeta$ in the event that the result of the discrimination deviates from the normal demodulating range.

11. A frequency demodulator as claimed in claim 5, wherein the reversal phenomenon compensation means comprises a memory having an input address represented by the digital demodulated signal obtained in the digital FM demodulating means by demodulating the FM signal of the type having the upper and lower side-bands suppressed and emphasized, respectively, said memory means having a content which is equal to the input address when the input address is within the normal demodulating range of $\alpha$ to $\beta$, but which is a compensation value $\zeta$ set in the vicinity of the upper limit value $\beta$ of the normal modulating range when the input address deviates from the normal demodulating range of $\alpha$ to $\beta$.

12. A frequency demodulator as claimed in claim 6, wherein the reversal phenomenon compensation means comprises:

a constant generator for generating the lower limit value $\alpha$ of the normal demodulating range for the digital demodulated signal;

a constant generator for generating the upper limit value $\beta$ of the normal demodulating range;

a constant generator for generating the compensation value set to be a value smaller than the upper limit value and in the vicinity of the upper limit value $\beta$;

a first discriminator means including said constant generators and for generating the lower limit value $\alpha$ and the upper limit value $\beta$, respectively, and adapted to receive the digital demodulated signal obtained in the digital demodulating means by demodulating the FM signal of the type having lower and upper side-bands suppressed and emphasized, respectively, and operable to discriminate whether or not the level of the digital demodulated signal deviates from the normal demodulating range of $\alpha$ to $\beta$;

a first selector means for selecting the lower limit value $\alpha$ if an output form the discriminator means is affirmative, but for selecting the digital demodulated signal if the output from the discriminator means is negative;

a delay circuit for delaying an output from the first selector means for a length of time equal to one sampling cycle T;

a second discriminator means for discriminating whether or not both levels of the outputs from the first selector means and the delay circuit are equal to the lower limit value $\alpha$; and a second selector means for selecting the compensation value $\gamma$ if an output from the second discriminator means is affirmative, but for selecting the output from the first selector means if the output form the second discriminator means is negative.

13. A frequency demodulator as claimed in claim 7, wherein the reversal phenomenon compensation means comprises:

a constant generator for generating the lower limit value $\alpha$ of the normal demodulating range for the digital demodulated signal;

a constant generator for generating the upper limit value $\beta$ of the normal demodulating range;

a constant generator for generating the compensation value set to be a value larger than the lower limit value $\alpha$ and in the vicinity of the lower limit value $\alpha$;

a first discriminator means including said constant generators and for generating the lower limit value $\alpha$ and the upper limit value $\beta$, respectively, and adapted to receive the digital demodulated signal obtained in the digital demodulating means by demodulating the FM signal of the type having upper and lower side-bands suppressed and emphasized, respectively, and operable to discriminate whether or not the level of the digital demodulated signal deviates from the normal demodulating range of $\alpha$ to $\beta$;

a first selector means for selecting the upper limit value if an output form the discriminator means is affirmative, but for selecting the digital demodulated signal if the output form the discriminator means is negative;

a delay circuit for delaying an output from the first selector means for a length of time equal to one sampling cycle T;

a second discriminator means for discriminating whether or not both levels of the outputs from the first selector means and the delay circuit are equal to the upper limit $\beta$; and a second selector means for selecting the compensation value $\delta$ if an output from the second discriminator means is affirmative, but for selecting the output from the first selector means if the output form the second discriminator means is negative.

* * * * *